(12) United States Patent
Liaw

(10) Patent No.: US 8,969,974 B2
(45) Date of Patent: Mar. 3, 2015

(54) STRUCTURE AND METHOD FOR FINFET DEVICE

(75) Inventor: Jhon Jhy Liaw, Zhudong Township, Hsinchu County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 154 days.

(21) Appl. No.: 13/523,658

(22) Filed: Jun. 14, 2012

(65) Prior Publication Data

US 2013/0334614 A1    Dec. 19, 2013

(51) Int. Cl.
    *H01L 27/088*      (2006.01)
(52) U.S. Cl.
    USPC .............. 257/401; 257/E27.06; 257/E21.628

(58) Field of Classification Search
    USPC ............................. 257/401, E27.06, E21.628
    See application file for complete search history.

(56) References Cited

U.S. PATENT DOCUMENTS

| 8,110,466 B2* | 2/2012 | Shieh et al. | 438/268 |
| 8,399,931 B2* | 3/2013 | Liaw et al. | 257/369 |
| 2013/0115721 A1* | 5/2013 | Clark | 438/12 |

* cited by examiner

*Primary Examiner* — Trung Q Dang
(74) *Attorney, Agent, or Firm* — Haynes and Boone, LLP

(57) ABSTRACT

The present disclosure provides one embodiment of a field effect transistor (FET) structure. The FET structure includes shallow trench isolation (STI) features formed in a semiconductor substrate; a plurality of semiconductor regions defined in the semiconductor substrate and isolated from each other by the STI features; and a multi-fin active region of a first semiconductor material disposed on one of the semiconductor regions of the semiconductor substrate.

19 Claims, 17 Drawing Sheets

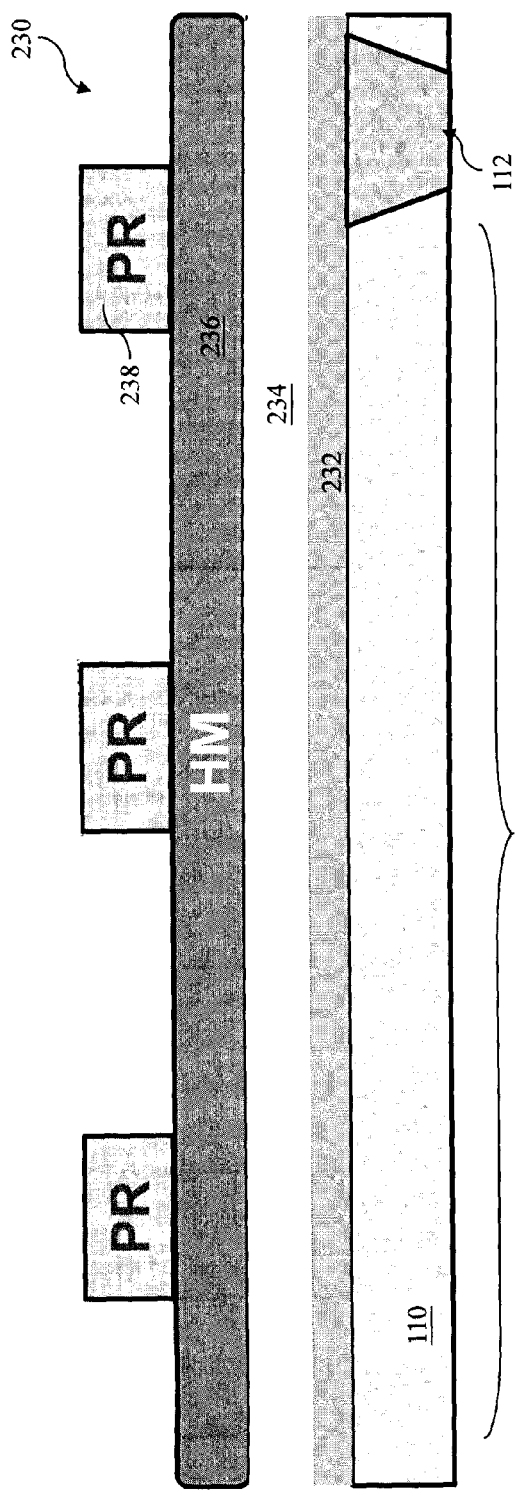
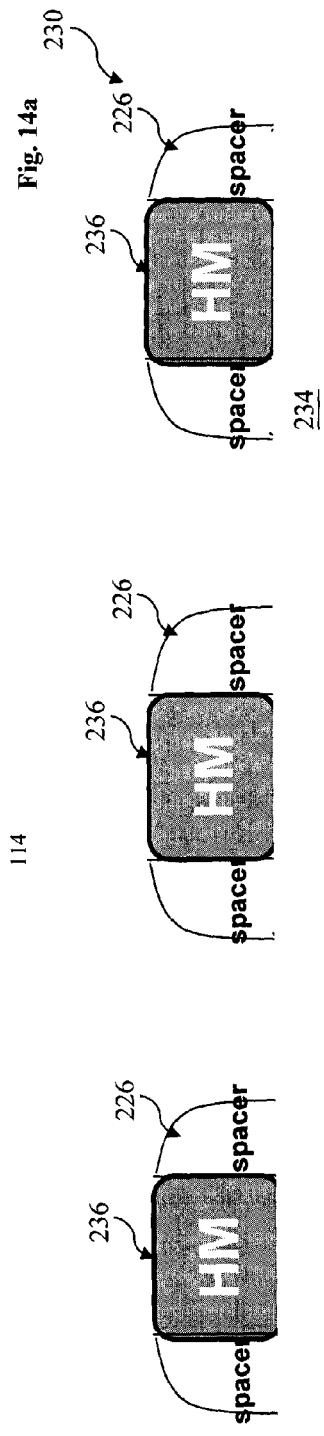
Fig. 14a
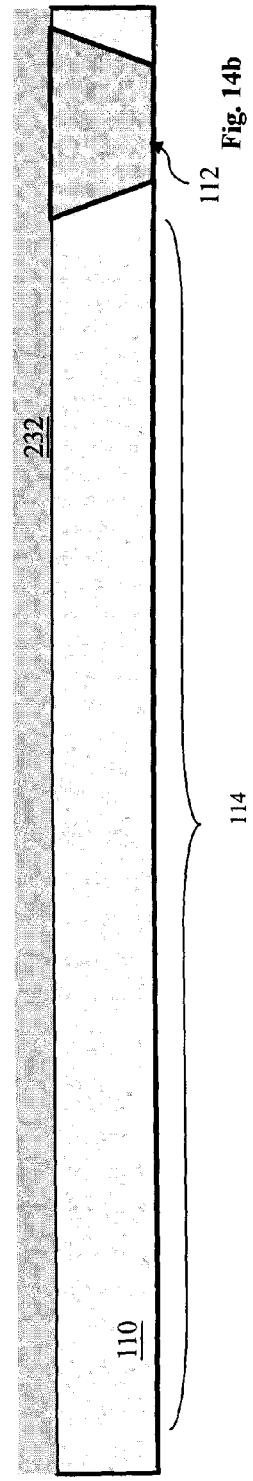
Fig. 14b

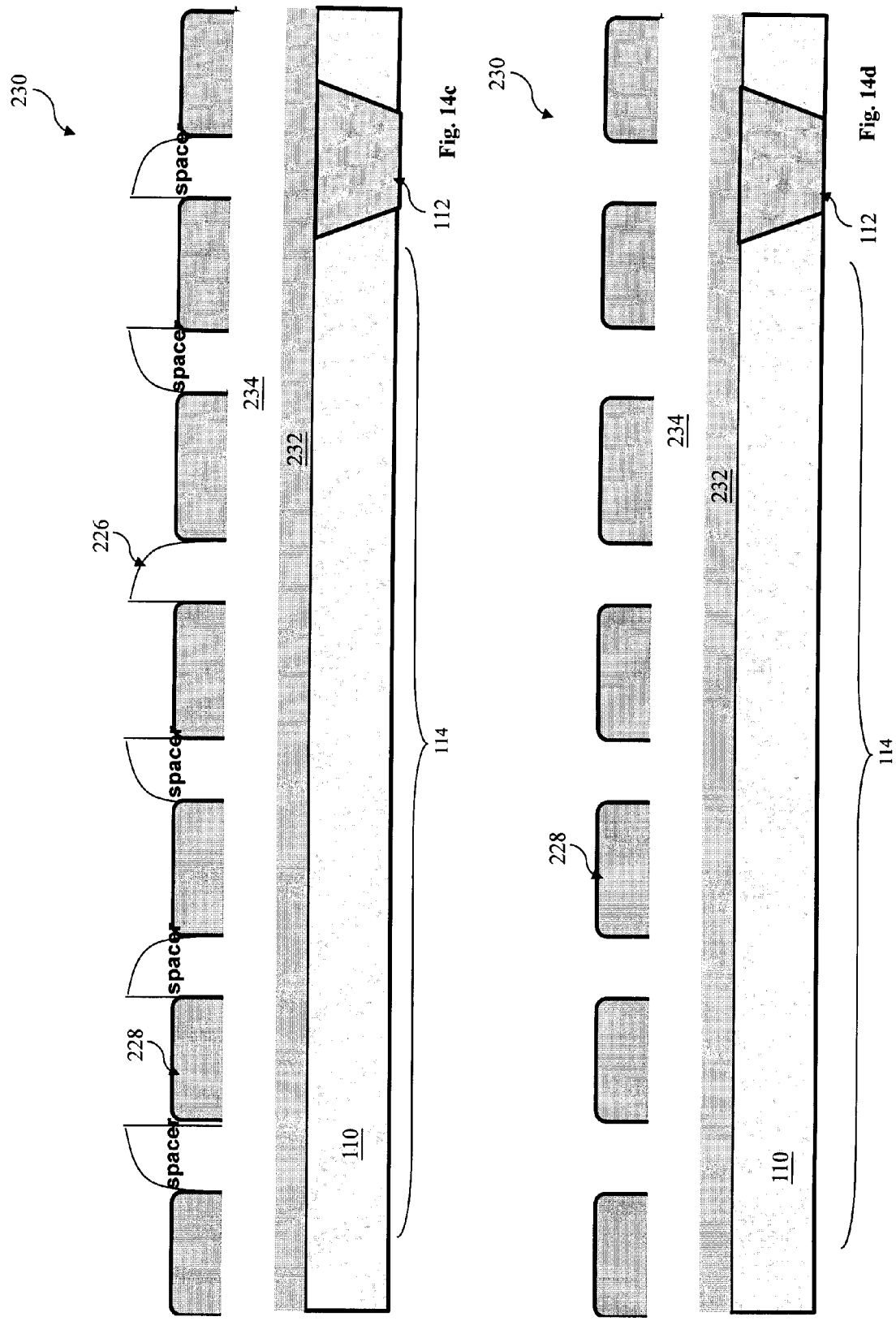

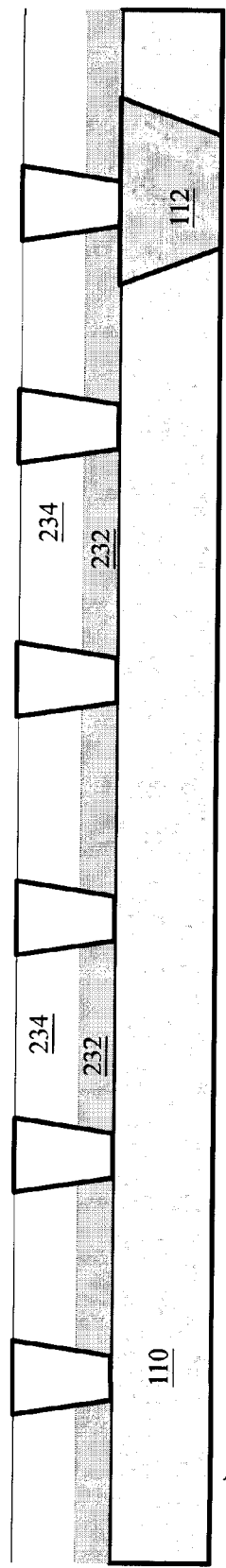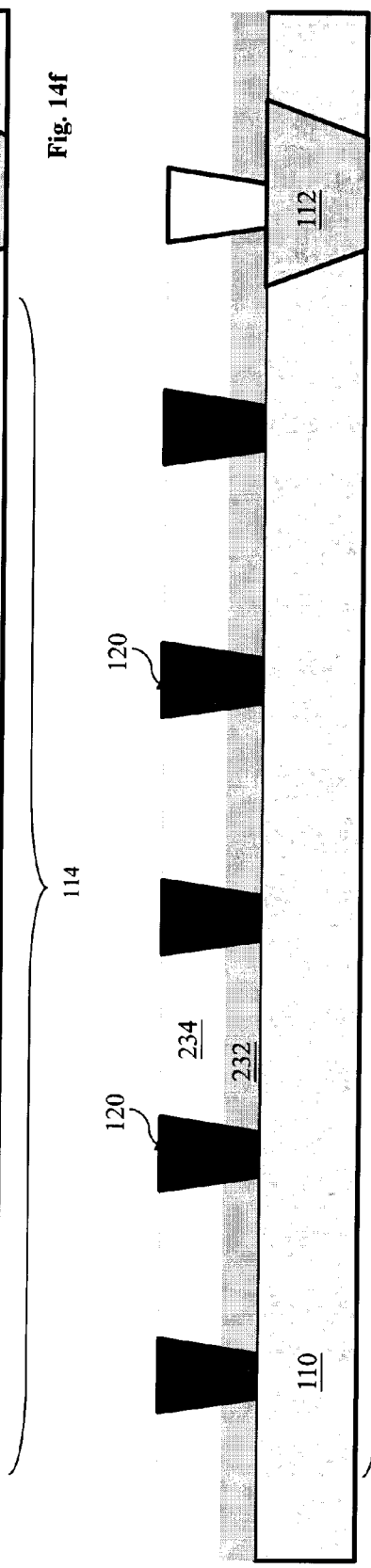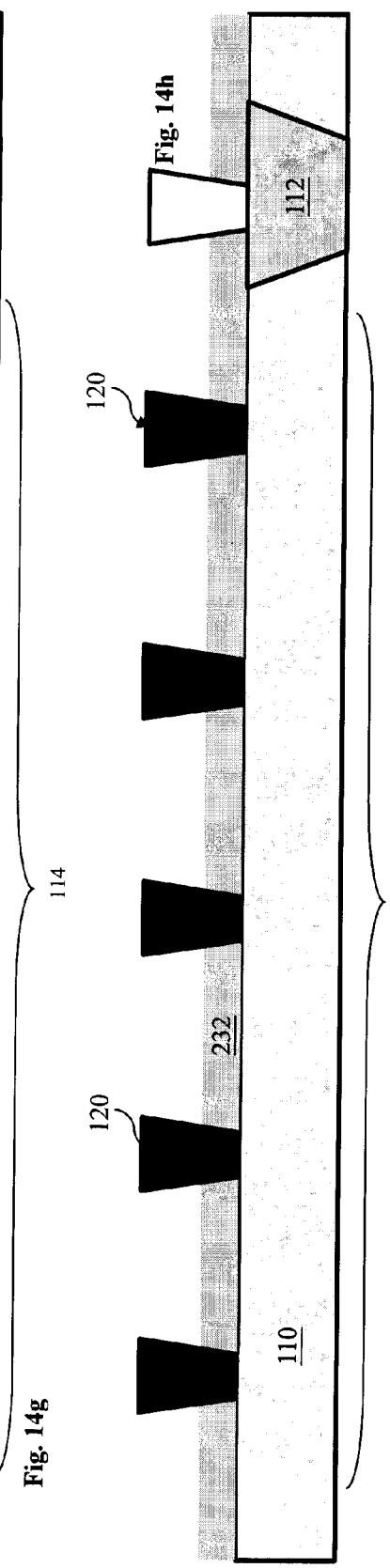

US 8,969,974 B2

STRUCTURE AND METHOD FOR FINFET DEVICE

BACKGROUND

Integrated circuits have progressed to advanced technologies with smaller feature sizes, such as 32 nm, 28 nm and 20 nm. In these advanced technologies, three dimensional transistors each having a multi-fin structure are often desired for enhanced device performance. However, existing methods and structures for such structures have various concerns and disadvantages associated with device quality and reliability. For example, fin height is defined by oxide recess. Therefore the fin height control will strongly depend on the factors including oxide quality, etch stability and fin bottom oxide shape. In another example, shallow trench isolation (STI) deposition/anneal will induce a stress, resulting in the fin distortion. This is the tradeoff between oxide quality and fin distortion ratio. In yet another example, the fin profile is defined by one etch step. It is challenging to have well control on fin profile and easily results in a taper fin shape (80~87 degree) since the fin etch needs to cover different requirements including top shape and bottom shape.

Therefore, there is a need for a structure and method for a multi-fin device to address these concerns for enhanced performance and reduced fabrication cost.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 14*a* through 14*h* are sectional views of a semiconductor structure having a multi-fin structure at various fabrication stages constructed according to one or more embodiment.

DETAILED DESCRIPTION

Figure 1:
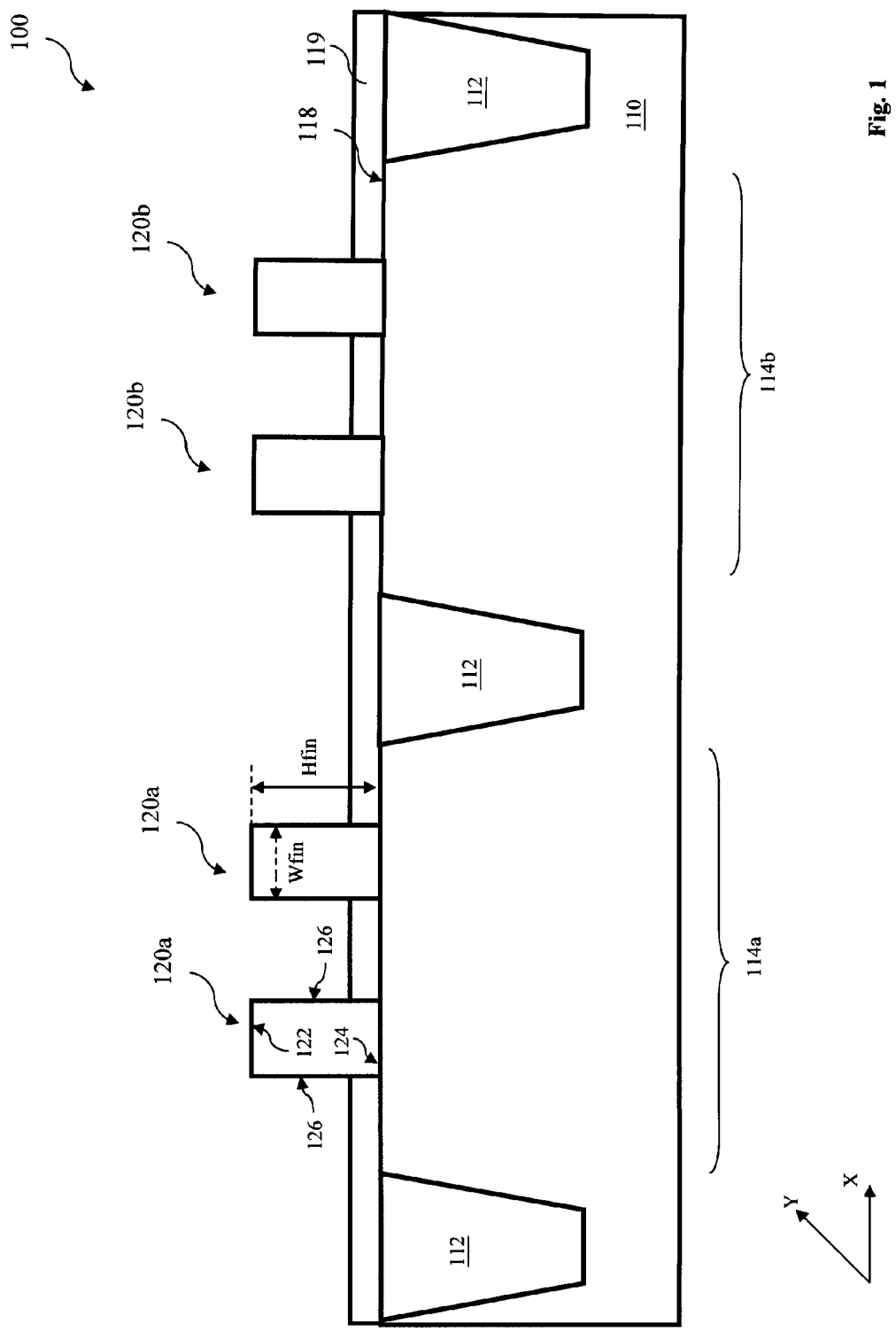
FIGS. 1-2 are sectional views of a semiconductor structure having a multi-fin structure at various fabrication stages constructed according to one or more embodiments.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Figure 2:
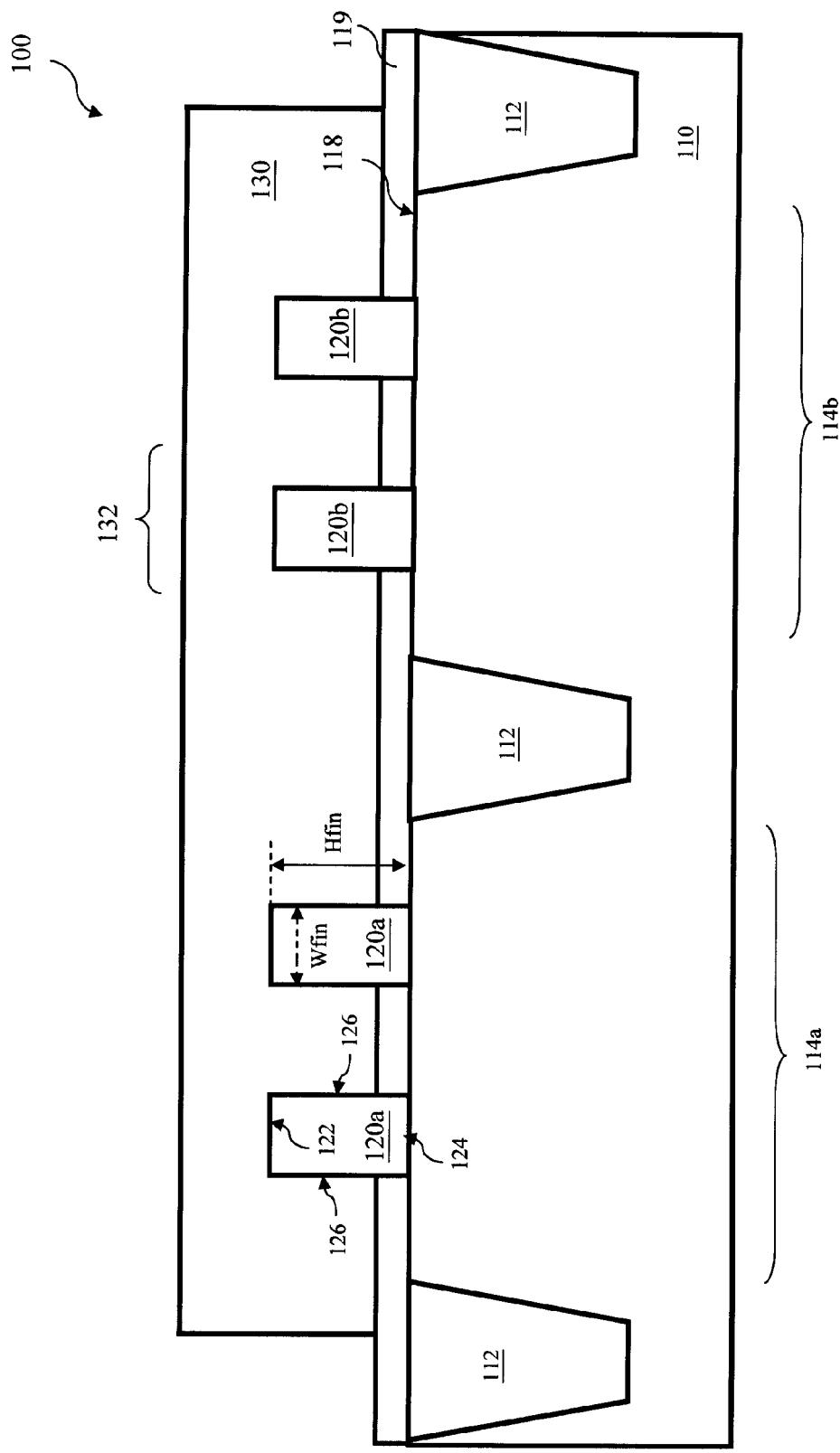

FIGS. 1 and 2 are sectional views of a semiconductor structure 100 at various fabrication stages constructed according to one or more embodiment. In one embodiment, the semiconductor structure 100 includes one or more field effect transistor (FET).

Referring to FIG. 1, the semiconductor structure 100 includes a semiconductor substrate 110. The semiconductor substrate 110 includes silicon. Alternatively, the substrate includes germanium, silicon germanium or other proper semiconductor materials. The semiconductor substrate 110 also includes various doped regions such as n-well and p-wells. In one embodiment, the semiconductor substrate 110 includes an epitaxy (or epi) semiconductor layer. In another embodiment, the semiconductor substrate 110 includes a buried dielectric material layer for isolation formed by a proper technology, such as a technology referred to as separation by implanted oxygen (SIMOX). In some embodiments, the substrate 110 may be a semiconductor on insulator, such as silicon on insulator (SOI).

Various shallow trench isolation (STI) features 112 are formed in the semiconductor substrate 110 and define various semiconductor regions 114, such as semiconductor regions 114*a* and 114*b*. The semiconductor regions 114 are separated and isolated from each other by the STI features 114. Furthermore, the top surface of the semiconductor substrate 110 and top surfaces of the STI features 112 are coplanar, resulting in a common top surface 118. In one embodiment, the formation of the STI features 114 includes, forming a hard mask with openings that define the regions for STI features; etching the semiconductor substrate 110 through the openings of the hard mask to form trenches; depositing dielectric material to fill in the trenches; and performing a chemical mechanical polishing (CMP) process. In one embodiment, the depth of the STI features 112 ranges between about 30 nm and about 250 nm.

In one embodiment, the formation of the STI features 112 further includes removing the hard mask after CMP. In another embodiment, the hard mask includes a silicon oxide layer by thermal oxidation and a silicon nitride on the silicon oxide layer by chemical vapor deposition (CVD). In yet another embodiment, the hard mask is removed after the CMP process.

In another embodiment, the deposition of the dielectric material further includes thermal oxidation of the trenches and then filling in the trenches by the dielectric material, such as silicon oxide, by CVD. In one example, the CVD process to fill in the trenches includes high density plasma CVD (HDPCVD).

In another embodiment, a dielectric material layer 119 is formed on the top surface 118 of the semiconductor substrate 110 by a technique, such thermal oxidation or CVD. The dielectric layer 119 may include silicon oxide, silicon nitride or other suitable dielectric material having a low dielectric constant. In one example, the dielectric layer 119 is a portion of a hard mask to be used to define various regions for fin features.

Various fin features 120, such as 120a and 120b, are formed on the semiconductor substrate 110. Particularly, a plurality of fin features on one semiconductor region, referred to as a multi-fin structure. For example, at least two fin features 120a (or 120b) are formed on the semiconductor region 114a (or 114b). The plurality of fin features 120 formed on one semiconductor region are separated and electrically isolated from other fin features by the STI features 112. The plurality of fin features 120 formed on one semiconductor region are connected to each other through the semiconductor substrate 110 within the respective semiconductor region, such as 114a or 114b.

Furthermore, the fin features 120 are formed on the top surface 118 and is above the top surface 118 but the STI features 112 is below the top surface 118. State differently, the fin features 120 are vertically above the STI features 112. The dielectric layer 119 separates the fin features 120 in the horizontal direction. With low dielectric constant, the presence of the dielectric layer 119 is able to reduce capacitive coupling between fin features induced by the high k dielectric material of the gate stacks.

The fin features 120 are formed by epitaxy growth with a semiconductor material. In one embodiment, the semiconductor material is different from the semiconductor material of the semiconductor substrate 110 for strained effect and enhanced mobility. In one embodiment, the semiconductor substrate 110 includes silicon and the fin features 120 for p-type FETs include a semiconductor material selected from the group consisting of silicon germanium, silicon germanium carbide, germanium, silicon and combinations thereof. In one embodiment, the semiconductor substrate 110 includes silicon and the fin features 120 for n-type FETs include a semiconductor material selected from the group consisting of silicon phosphoric, silicon carbide, silicon and combinations thereof.

In another embodiment, the fin features for p-type FETs and the fin features for n-type FETs are separately epitaxy grown using respective semiconductor materials. As one example for illustration, the semiconductor region 114a is for p-type FETs and the semiconductor region 114b is for n-type FETs. In this case, the fin features 120a includes a first semiconductor material selected from the group consisting of silicon germanium, silicon germanium carbide, germanium, silicon and combinations thereof. The fin features 120b includes a second semiconductor material selected from the group consisting of silicon phosphoric, silicon carbide, silicon and combinations thereof.

In one embodiment, the formation of the multi-fin structure includes forming a hard mask having openings that define the regions for fin features; epitaxy growing fin features on the semiconductor substrate within the openings of the hard mask; performing a CMP process; and thereafter removing the hard mask. In another embodiment where the semiconductor regions for p-type FETs and the respective fin features are epitaxy grown with the first semiconductor material, the semiconductor regions for n-type FETs and the respective fin features are epitaxy grown with the second semiconductor material, the formation of the fin features 120 includes respective hard mask formation and respective epitaxy growth. For example, the fin feature 120a are formed by a first procedure that includes forming a first hard mask defining openings for fin features 120a, performing a first epitaxy growth using the first semiconductor material, and removing the first hard mask. The fin feature 120b are formed by a second procedure that includes forming a second hard mask defining openings for fin features 120b, performing a second epitaxy growth using the second semiconductor material, and removing the second hard mask.

The fin features has a profile in the sectional view as illustrated in FIG. 1. The sectional profile of the fin feature includes a top surface 122, a bottom surface 124 and sidewalls 126. Particularly, the fin features 120 has a height $H_{Fin}$ and width $W_{Fin}$. In one embodiment, the fin features 120 each have a rectangle shape and the sidewalls 126 each have an intersecting angle with the top surface 118 of about 90 degrees.

In other embodiments that will be described later, the sidewalls are tilted toward the respective fin feature and intersecting angle is greater than 90 degrees. In yet another embodiment, the sectional profile of the fin feature includes other geometries. Other methods to form the fin features are described later according to various embodiments.

Referring to FIG. 2, the fin features 120 may be further trimmed by an etch process, such as wet etch, to reduce the width of the fin features. The trimming process may be further tuned to modify the profile of the fin features. The semiconductor structure 100 includes gate stack 130 formed on one or more fin features 120. In the present example, the gate stack 130 is formed on both the fin features 120a in the semiconductor region 114a and the fin features 120b in the semiconductor region 114. Various field effect transistors are formed thereby. For example, a field effect transistor 132 is formed in the semiconductor region 114b and associated with one of the fin features 120b. In furtherance of the present example, the semiconductor structure 100 is a portion of a static random access memory (SRAM) cell.

The gate stack 130 includes gate dielectric layer and a gate electrode layer disposed on the gate dielectric layer. The gate dielectric layer includes a dielectric material, such as silicon oxide, high k dielectric material layer or a combination thereof. In another embodiment, the gate dielectric layer includes an interfacial layer (such as a silicon oxide layer) and a high k dielectric material layer on the interfacial layer. The gate electrode layer includes a conductive material layer, such as doped polycrystalline silicon (polysilicon), metal, metal alloy or combinations thereof.

The gate stack 130 may be formed by a procedure that includes forming a gate dielectric layer, forming a gate electrode layer on the gate dielectric layer, and patterning the gate electrode layer and the gate dielectric layer to form one or more gate stacks. The formation of the gate stack 130 may further include a gate replacement procedure to replace the previously formed gate stack having high k dielectric and metal. The gate replacement may include a gate last operation or a high k last operation where both gate dielectric and gate electrode are replaced at a later fabrication stage.

Still referring to FIG. 2, various source and drain features are formed on the fin features, resulting in one or more FETs. The source and drain features may include both light doped drain (LDD) features and heavily doped source and drain (S/D). For example, the FET 132 includes source and drain features formed on the respective fin feature 120b in the semiconductor region 114b and interposed by the gate stack 130. A channel is formed in the fin feature, is under the gate stack, and is defined between the source and drain features.

The semiconductor structure 100 may include other doped features, such as doped wells and doped channels. In the present embodiment, a n-type doped well is formed in semiconductor substrate 110 within the semiconductor region 114a and a p-type doped well is formed in the semiconductor substrate 110 within the semiconductor region 114b.

Figure 3:
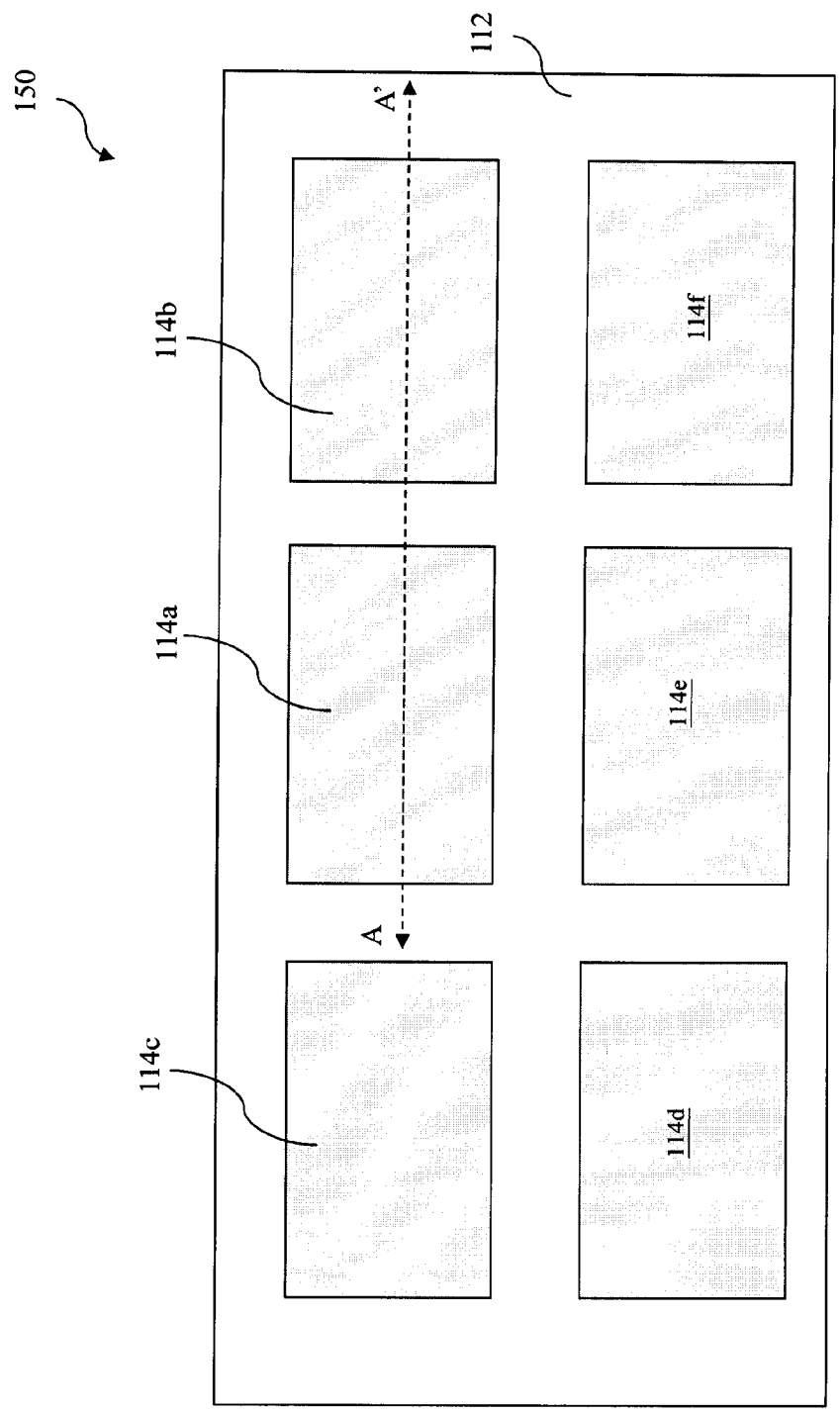
FIGS. 3-5 are top views of a semiconductor structure having a multi-fin structure constructed according to various embodiments.
Figure 4:
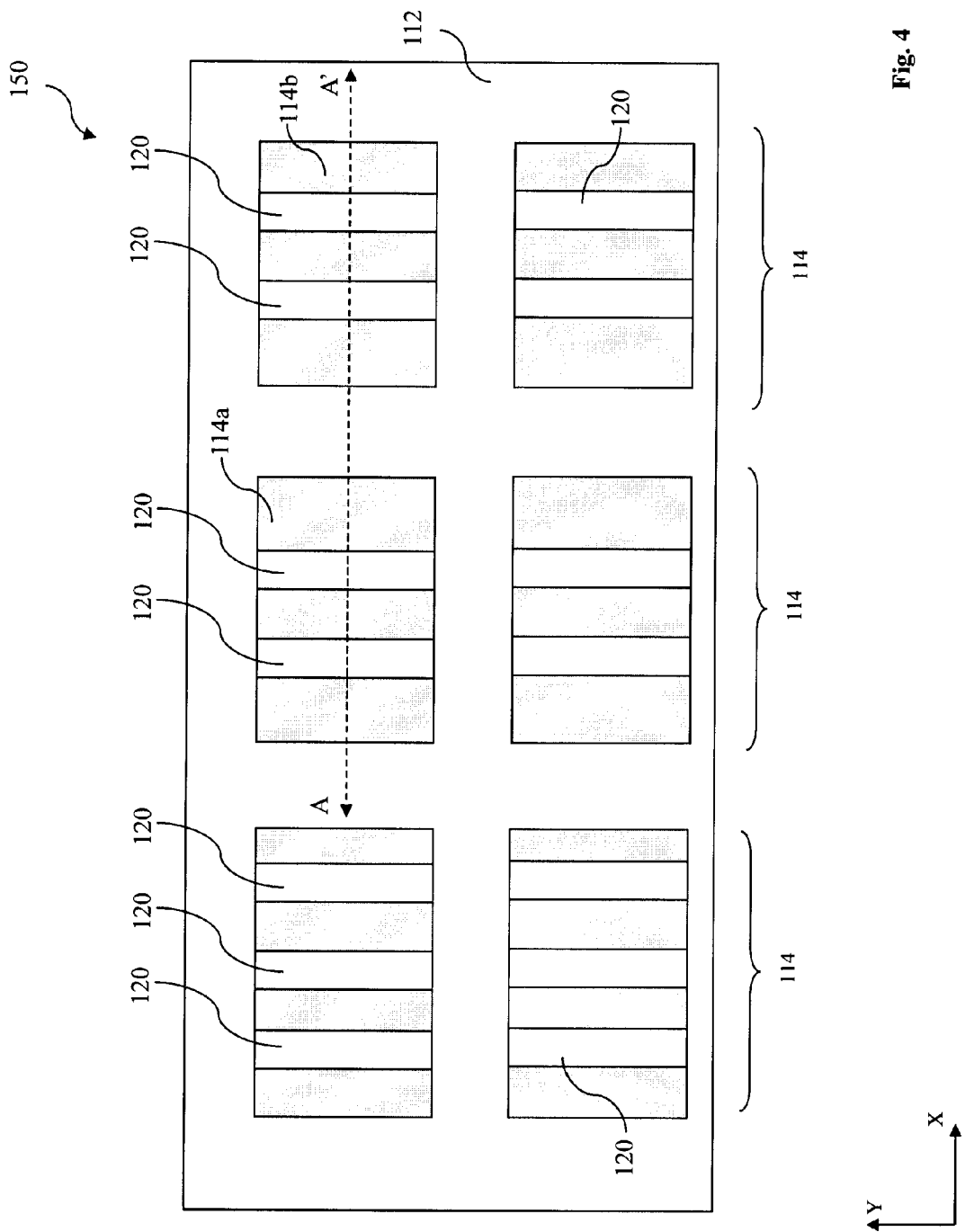
Figure 5:
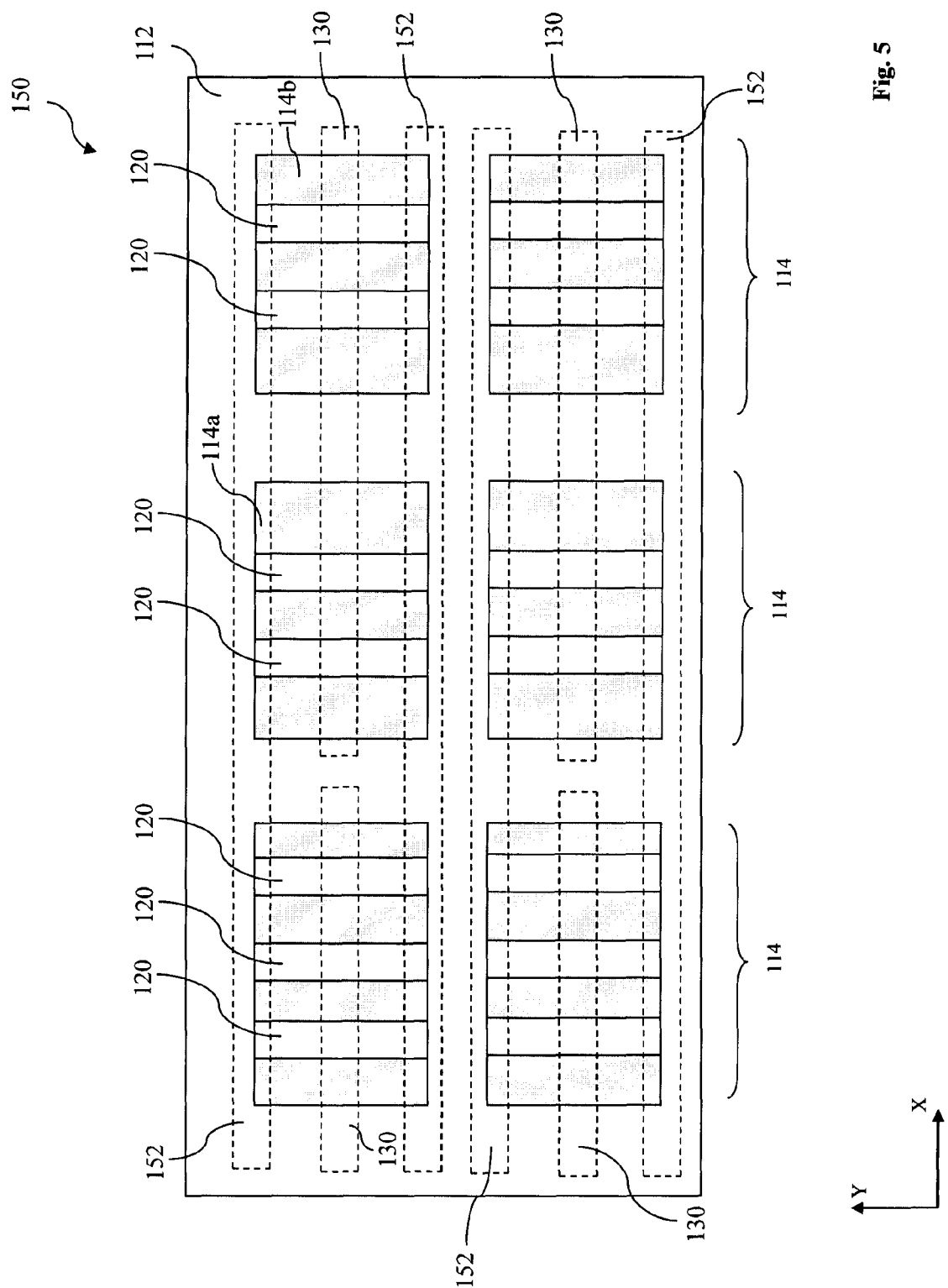

FIGS. 3 through 5 are top views of a semiconductor structure 150 at various fabrication stages. The semiconductor structure 150 includes a multi-fin structure, such as those in FIGS. 1 and 2. In the present embodiment, the semiconductor structure 100 is a portion of the semiconductor structure 150 shown in a sectional view and taken from the dashed line AA'. The description of the semiconductor structure 150 is provided below with similar language eliminated for simplicity.

Referring to FIG. 3, the semiconductor structure 150 includes STI features 112 formed in the semiconductor substrate 110, defining various semiconductor regions 114 of the semiconductor substrate. For example, the semiconductor regions includes a first semiconductor region 114a and a second semiconductor region 114b, and other semiconductor regions 114c, 114d, 114e and 114f. various doping processes are applied to the semiconductor regions to form various doped wells, such as n-wells and p-wells. In one embodiment, p-wells are formed in the semiconductor regions 114b, 114c, 114d and 114f for n-type FETs, and n-wells are formed in the semiconductor regions 114a and 114e for p-type FETs. For example, the first semiconductor region 114a is configured for one or more p-type FETs and the second semiconductor region 114b is configured for one or more n-type FETs. Various doped wells may be formed in the semiconductor substrate. For example, a n-type doped well is formed in the first semiconductor region 114a and a p-type doped well is formed in the second semiconductor region 114b by respective ion implantations.

Referring to FIG. 4, various fin features 120 are formed on the semiconductor substrate 110. Especially, each semiconductor region includes multiple fin features 120 spaced away from each other in a first direction (X direction) and oriented in a second direction (Y direction) perpendicular to the first direction. For example, the first semiconductor region 114a includes two fin features oriented in the second direction (Y direction). The second semiconductor region 114b includes another two fin features oriented in the second direction (Y direction). In the present embodiment, the two fin features in the first semiconductor region 114a include a first semiconductor material for proper strained effect. The two fin features in the second semiconductor region 114b include a second semiconductor material different from the first semiconductor material for proper strained effect.

Referring to FIG. 5 various gate stacks 130 are formed on the fin features 120. In the present embodiment, the gate stacks 130 are oriented in the first direction (X direction). For example, one gate stack 130 is disposed on both the first semiconductor region 114a and the second semiconductor region 114b. Furthermore, various dummy gate stacks 152 are formed on the semiconductor substrate 110 to improve the uniformity of the pattern density and enhance the fabrication integrity. In the present embodiment, the dummy gate stacks 152 are disposed partially on the semiconductor regions 114 and partially on the STI features. The dummy gate stacks 152 are oriented in the same direction (X direction) as the gate stacks 130. In one embodiment, the dummy gate stacks 152 are formed simultaneously with the gate stacks 130 in a same procedure.

Figure 6:
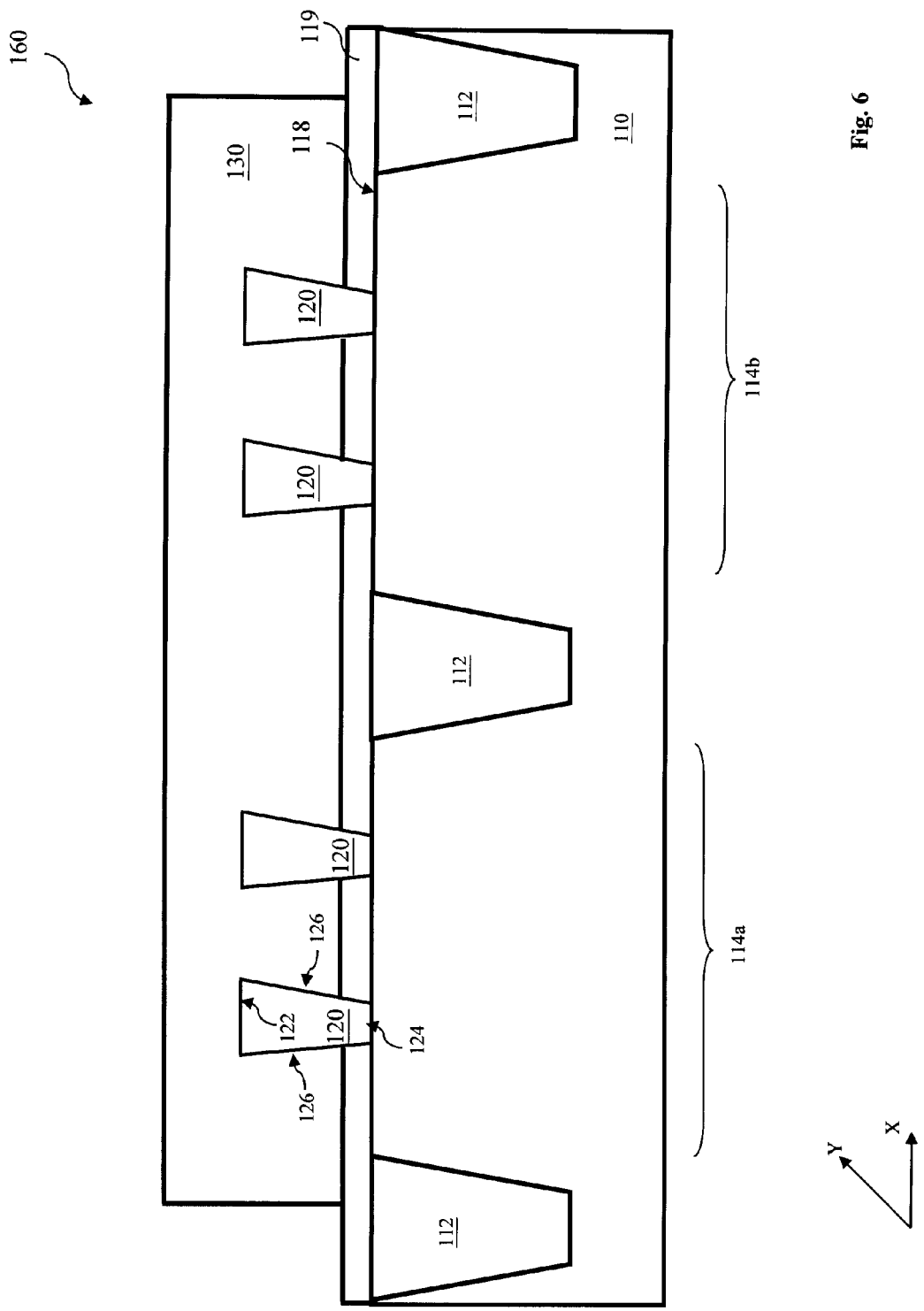
FIG. 6 is a sectional view of a semiconductor structure having a multi-fin structure constructed according to other embodiments.

FIG. 6 is a sectional view of a semiconductor structure 160 constructed according to aspects of the present disclosure in various embodiments. The semiconductor structure 160 has a multi-fin structure that includes multiple fin features disposed in a continuous semiconductor region (such as 114a or 114b) that is surrounded by STI features 112. The multiple fin features in the same semiconductor region are spaced from each other in the first direction (X direction) and oriented in the second direction (Y direction) perpendicular to the first direction. The semiconductor structure 160 is another embodiment of the semiconductor structure 100 of FIG. 2.

Figure 7:
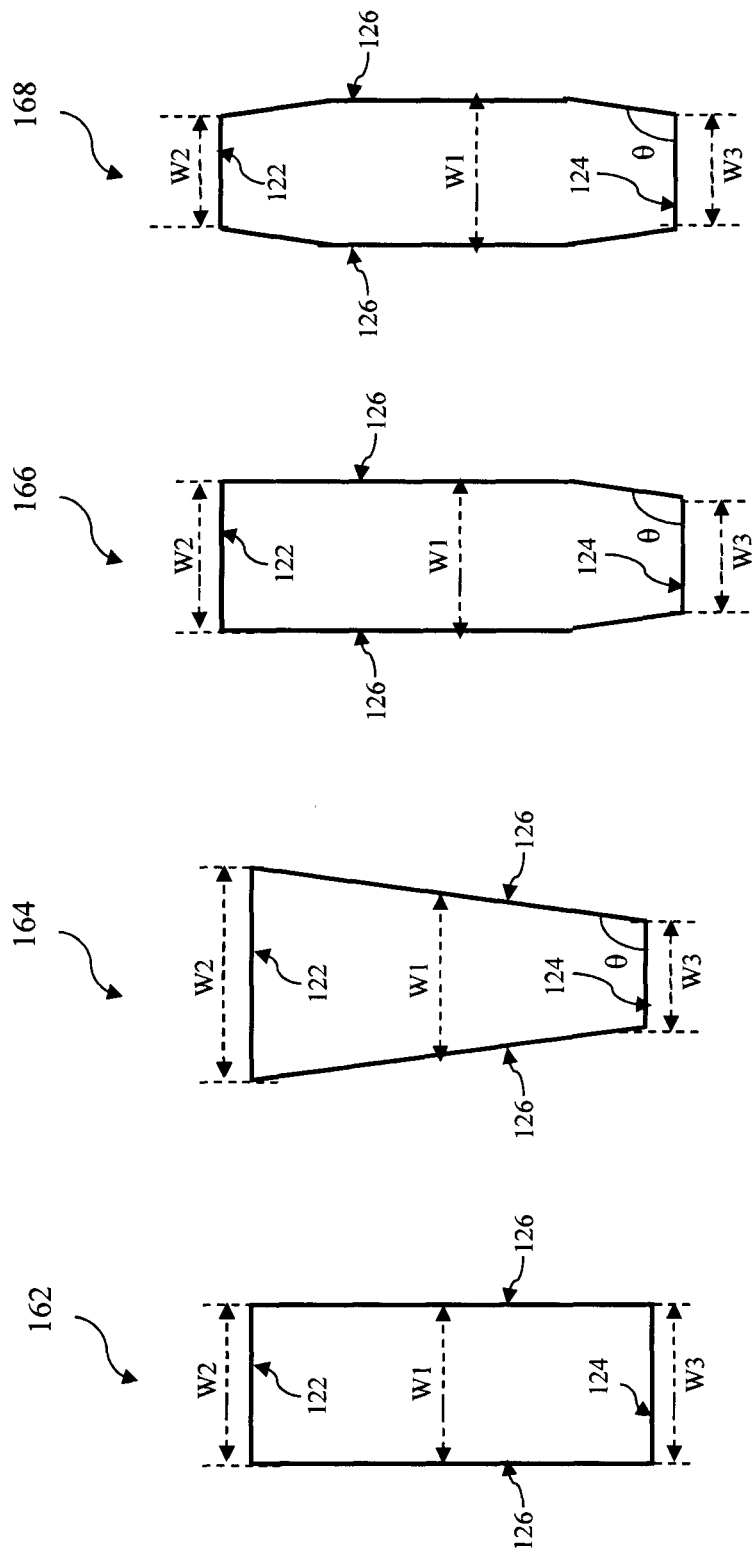
FIG. 7 illustrate sectional views of a fin profile in the semiconductor structure of FIG. 7 constructed according to various embodiments.

In the semiconductor structure 160, the fin features 120 have a sectional profile that includes a top surface 122, a bottom surface 124 and sidewalls 126. The sectional profile is illustrated in FIG. 7 according to various embodiments. The sectional profile 162 of the fin features 120 has a rectangle geometry that has a first width W1 in the central portion, a second width W2 at the top surface 122 and a third width W3 at the bottom surface 124. The widths W1, W2 and W3 are substantially same. The intersecting angle between the bottom surface 124 and the sidewall 126 is substantially a right angle (or 90 degree). It is be noted that the bottom surface of the fin feature 120 is coplanar with the top surface 118 of the semiconductor substrate 110.

In another embodiment, a sectional profile 164 of the fin features 120 has a non-rectangle geometry (or a taper geometry) that has a first width W1 in the central portion, a second width W2 at the top surface 122 and a third width W3 at the bottom surface 124. The widths W1, W2 and W3 are not same. Particularly, W1 is greater than W2 and W3 is greater than W1. The intersecting angle $\theta$ between the bottom surface 124 and the sidewall 126 is greater than 90 degree. In one example, the intersecting angle $\theta$ ranges between about 91 degree and about 100 degree.

In yet another embodiment, a sectional profile 166 of the fin features 120 has a non-rectangle geometry that has a first width W1 in the central portion, a second width W2 at the top surface 122 and a third width W3 at the bottom surface 124. The widths W1 and W2 are substantially same. The third width W3 is substantially less than the first width W1 (and the second width W2). Particularly, the sectional profile 166 has a shrunken bottom portion and the intersecting angle $\theta$ between the bottom surface 124 and the sidewall 126 is greater than 90 degree. In one example, the intersecting angle $\theta$ ranges between about 91 degree and about 100 degree.

In yet another embodiment, a sectional profile 168 of the fin features 120 has a non-rectangle geometry that has a first width W1 in the central portion, a second width W2 at the top surface 122 and a third width W3 at the bottom surface 124. The widths W1, W2 and W3 are not same. The third width W3 is substantially less than the first width W1 and the second width W2 is substantially less than the first width W1. Particularly, the sectional profile 168 has a shrunken bottom portion and the intersecting angle $\theta$ between the bottom surface 124 and the sidewall 126 is greater than 90 degree. In one example, the intersecting angle $\theta$ ranges between about 91 degree and about 100 degree.

Figure 8:
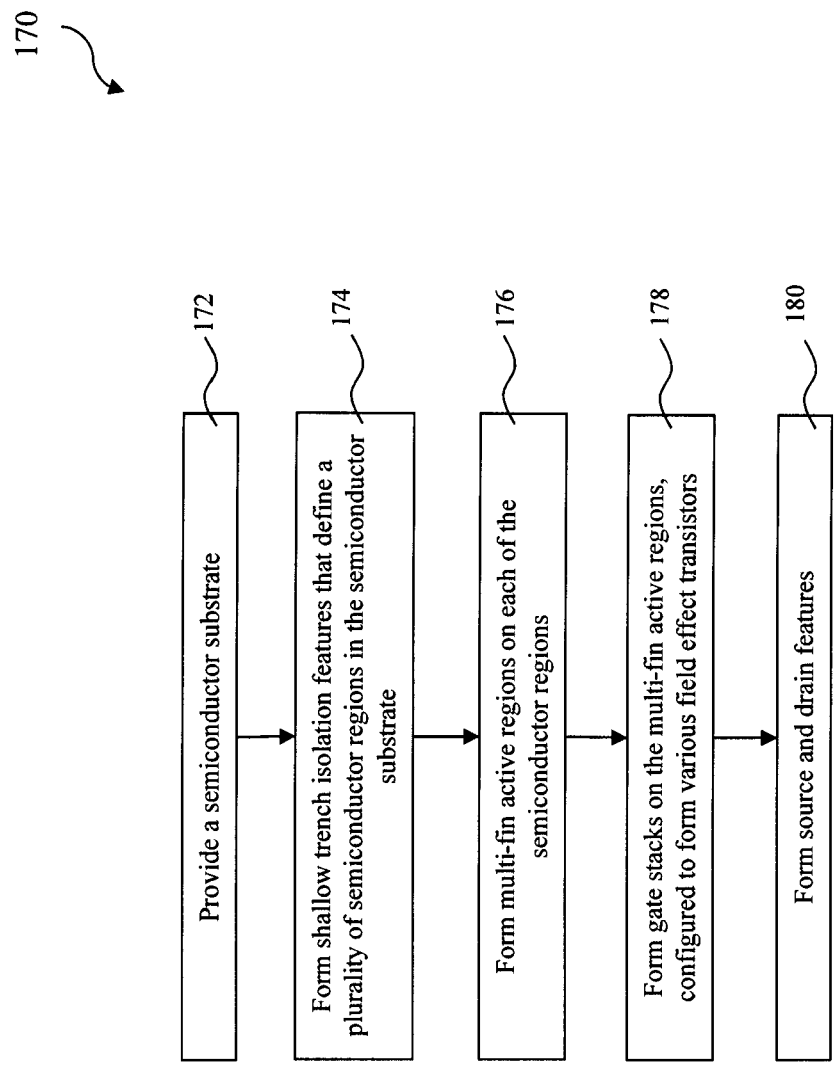
FIG. 8 is a flowchart of a method making a semiconductor device having a multi-fin structure constructed according to various aspects of the present disclosure in one embodiment.

FIG. 8 provides one embodiment of a flowchart of a method 170 for making the semiconductor structure 100 having a multi-fin structure. The method 170 is described below with reference to FIGS. 1, 2, 8 and other figures (such as FIGS. 3-7). The method 170 includes an operation 172 by providing a semiconductor substrate 110, such as a silicon wafer.

The method 170 includes an operation 174 by forming a plurality of STI features 112 in the semiconductor substrate 110, defining a plurality of continuous semiconductor regions 114 each being surrounded by STI features 112.

The method 170 includes an operation 176 by forming multi-fin structure (or multi-fin active region) on each of the semiconductor regions 114. The multi-fin structure includes multiple fin features 120 disposed in the same semiconductor region 114. The multiple fin features 120 are spaced from other in the first direction (X direction) and are oriented in the second direction (Y direction) perpendicular to the first direction. Especially, the fin features 120 are disposed on the top surface 118 and are above the top surface in the vertical direction perpendicular to the top surface. The STI features 112 are disposed below the top surface 118 in the vertical direction.

The method 170 includes an operation 178 by forming various gate stacks 130 on the fin features 120 and the gate stacks 130 are configured to form various field effect transistors. In one embodiment, the field effect transistors includes n-type transistors and p-type transistors. In another example, those field effect transistors are configured to form one or more static random access memory (SRAM) cells. Each SRAM cell includes two cross-coupled inverters configured for data storage. In another embodiment, the operation 178 includes forming one or more dummy gate stacks on the semiconductor substrate 110 to increase the pattern density uniformity and enhance the fabrication quality. For example, the dummy gate stacks includes dummy gates 152 each being partially disposed on the STI features 112 and partially disposed on the semiconductor regions 114.

The method 170 also includes an operation 180 by forming various source and drain features to those field effect transistors. The source and drain features may include both light doped drain (LDD) features and heavily doped source and drain (S/D). For example, each field effect transistor includes source and drain features formed on a fin feature of the respective semiconductor region and interposed by the gate stack 130. A channel is formed in the fin feature, is under the gate stack, and is defined between the source and drain features.

Figure 9:
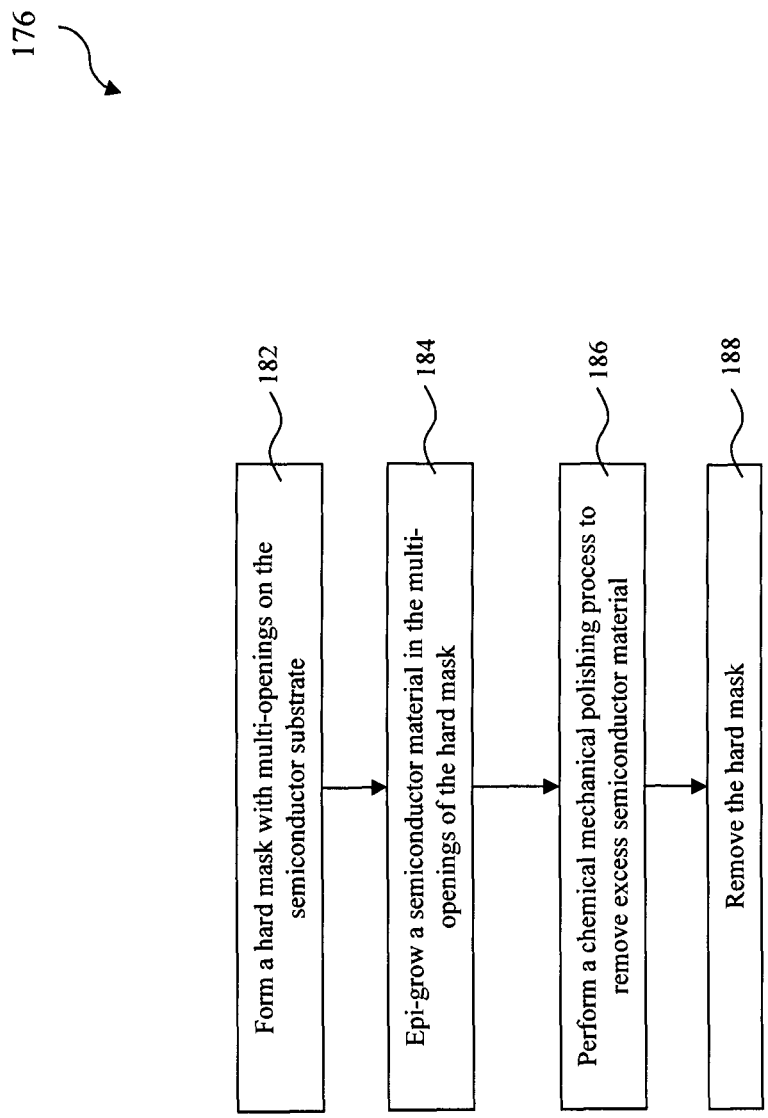
FIG. 9 is a flowchart of a method making a semiconductor device having a multi-fin structure constructed according to various aspects of the present disclosure in another embodiment.
Figure 10:
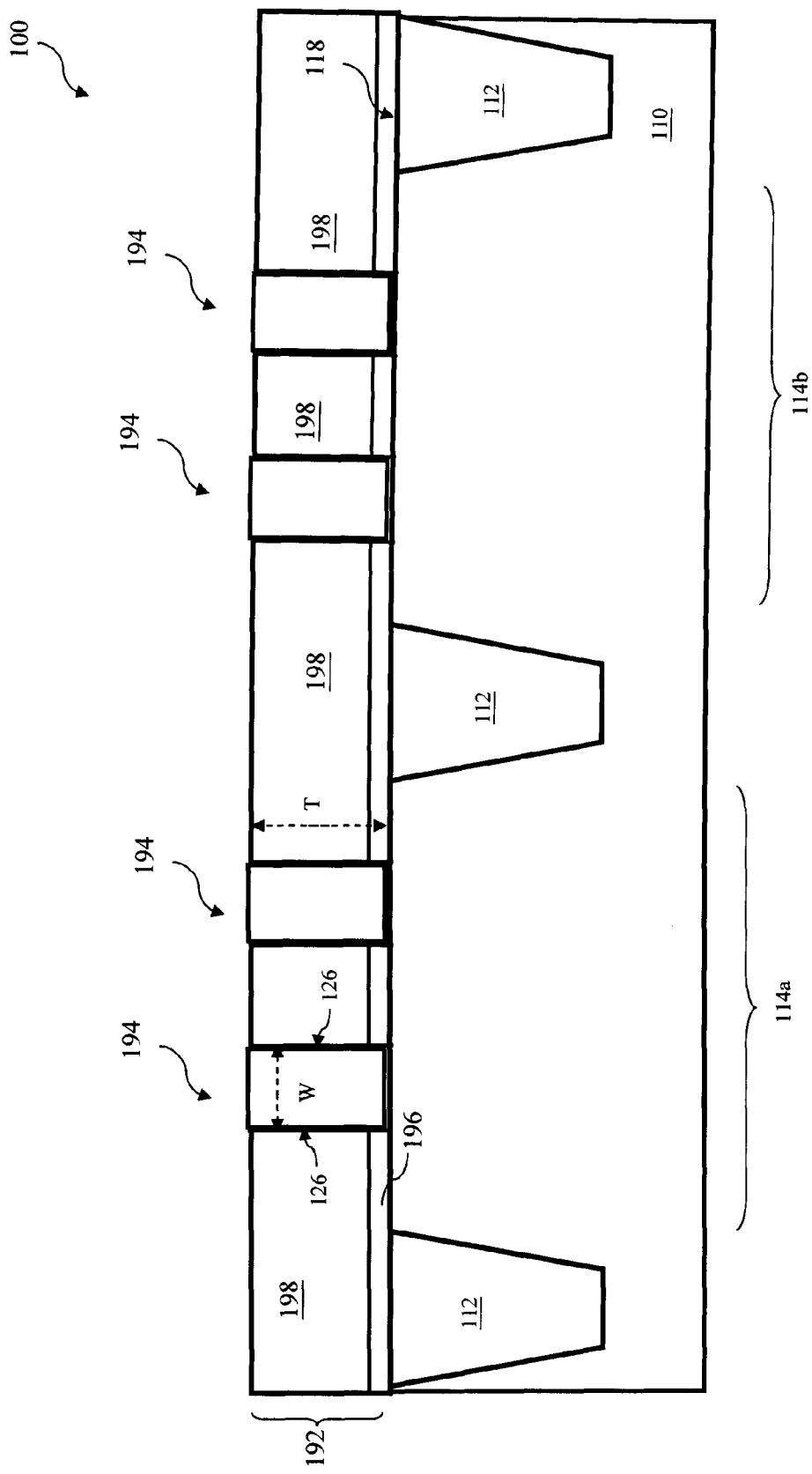
FIG. 10 is a sectional view of a semiconductor structure having a multi-fin structure at various fabrication stages constructed according to another embodiment.

The operation 176 to form the fin features 120 having a multi-fin structure is further described in a method 176 that is shown in FIG. 9 as a flowchart constructed according to various embodiments. FIG. 10 is a sectional view of the semiconductor structure 100 at a fabrication stage constructed according to one embodiment. The method 176 is described with reference to FIGS. 9, 10 and other figures (such as FIGS. 1 trough 8).

The method 176 includes a step 182 to form a hard mask 192 on the semiconductor substrate 110. The hard mask 192 includes with a plurality of openings 194 for various fin features. Especially, the openings 194 define a multi-fin structure having multiple fin features to be formed on the semiconductor substrate 110. Each opening 194 has a width W that defines the width of the respective fin feature to be formed. The thickness T of the hard mask 192 defines the height of the fin features.

In one embodiment, the hard mask 192 includes a first dielectric layer 196 (such as silicon oxide) formed on the semiconductor substrate 110 and a second dielectric layer 198 (such as silicon nitride) formed on the first dielectric layer. The hard mask 192 is formed by a procedure that includes deposition and patterning. For example, the first dielectric layer 196 of silicon oxide is formed by thermal oxidation. The second dielectric layer 198 of silicon nitride (SiN) is formed by chemical vapor deposition (CVD). For example, the SiN layer is formed by CVD using chemicals including Hexachlorodisilane (HCD or Si2Cl6), Dichlorosilane (DCS or SiH2Cl2), Bis(TertiaryButylAmino) Silane (BTBAS or C8H22N2Si) and Disilane (DS or Si2H6).

Step 182 further includes patterning the hard mask 192 by a procedure including a lithography process and an etching process. In the present embodiment, a patterned photoresist layer is formed on the hard mask 192 using a photolithography process including photoresist coating, soft baking, exposing, post-exposure baking (PEB), developing, and hard baking. Then, the hard mask layer 192 is etched through the openings of the patterned photoresist layer, forming a patterned hard mask by the etching process. The patterned photoresist layer is removed thereafter using a suitable process, such as wet stripping or plasma ashing. In one example, the etching process includes applying a dry (or plasma) etch to remove the hard mask 192 within the openings of the patterned photoresist layer. In another example, the etching process includes applying a plasma etch to remove the SiN layer 196 within the openings of the patterned photoresist layer, and a wet etch with a hydrofluoric acid (HF) solution to remove the SiO layer 194 within the openings.

The method 176 includes a step 184 by epitaxy growing a semiconductor material in the openings of the hard mask 192. In one embodiment, the semiconductor material fills in the openings 194 by epitaxy growth. In another embodiment, the semiconductor material grown in the openings 194 is different from the semiconductor material of the semiconductor substrate 110. In yet another embodiment, the first semiconductor material in the openings 194 within the semiconductor region 114a includes silicon germanium, silicon germanium carbide, germanium, silicon or a combination thereof. The second semiconductor material in the openings 194 within the semiconductor region 114b includes silicon phosphoric, silicon carbide, silicon or a combination thereof. The formation of the fin features 120 with different semiconductor materials may include forming a patterned resist layer to cover the openings 194 within the semiconductor region 114b, epitaxy growing the first semiconductor material in the openings 195 within the semiconductor region 114a, removing the patterned resist layer, and thereafter epitaxy growing the second semiconductor material in the openings 194 within the semiconductor region 114b while the first semiconductor region 114a is covered by another patterned resist layer or alternatively not covered (since the epitaxy growth only forms the second semiconductor material above the hard mask 192 in the semiconductor region 114b, which will be removed by subsequent polishing process).

The method 176 includes a step 186 by performing a polishing process, such as CMP, to remove excessive epitaxy grown semiconductor material above the hard mask 192 and planarize the surface of the semiconductor structure 100, resulting in the fin features 120 formed in various semiconductor regions 114 and having a multi-fin structure, such as those fin features 120 shown in FIG. 1.

The method 176 includes another step 188 by removing the hard mask 192 after the CMP process, resulting the semiconductor structure 100 as illustrated in FIG. 1. In an alternative embodiment, only the second dielectric layer 198 is removed but the first dielectric layer 196 remains after the etching. Therefore, the fin features 120 are separated by the first dielectric layer 196. The first dielectric layer 196 and the fin features 120 have a coplanar surface that is the top surface 118 of the semiconductor substrate 110.

The hard mask 192 used to form fin features 120 may be formed by other methods for dimension control, fin profile control and/or other considerations. For example, a reverse-tone process is used to form the hard mask 192, which will be described later. The semiconductor structure 100 may have other structures according to various embodiments.

FIGS. 11a through 11f are sectional views of a semiconductor structure 200 at different fabrication stages constructed according to various aspects of the present disclosure. The semiconductor structure 200 is one embodiment of the semiconductor structure 100. The semiconductor structure 200 and the method making the same are collectively described with reference to FIGS. 11a through 11f.

Figure 11:
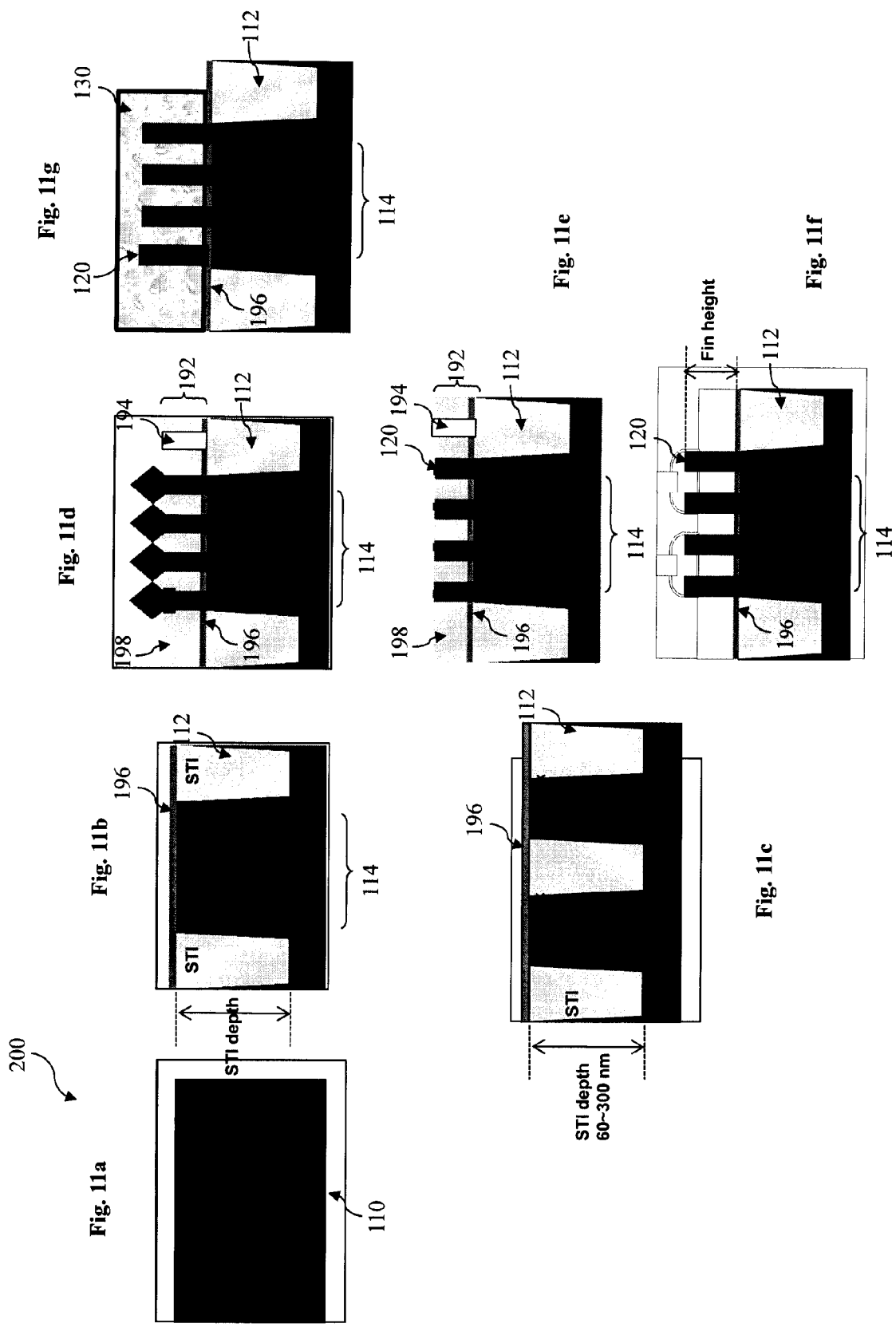
FIGS. 11*a* through 11*f* are sectional views of a semiconductor structure having a multi-fin structure at various fabrication stages constructed according to one or more embodiment.

A semiconductor substrate 110 is provided, as illustrated in FIG. 11a. Referring to FIG. 11b, various STI features 112 are formed in the semiconductor substrate 110, defining various semiconductor regions 114. Particularly, the semiconductor regions 114 and the STI features 112 have a coplanar top surface. Various doped features are formed in the semiconductor regions 114. In one embodiment, a doped well is formed in the semiconductor region 114 by an ion implantation using a proper type doping species, such as n-type dopant or p-type dopant. In another embodiment, one or more doping processes are applied to the channel region to form the channel for a field effect transistor, such as a metal-oxide-semiconductor field effect transistor (MOSFET). For example, an anti-punch-through (APT) doping process is applied to the channel region. A first dielectric layer 196, such as silicon oxide, is formed on the semiconductor substrate 110.

FIG. 11c illustrates another embodiment of the semiconductor structure 200 that includes two exemplary semiconductor region regions 114a and 114b, one for a p-type FET with a n-type well and another one for a n-type FET with a p-type well. Accordingly, the channel doping processes are implemented respectively. For example, the semiconductor region 114a includes a n-type APT doping profile by a respective ion implantation and the semiconductor region 114b includes a p-type APT doping profile by another respective ion implantation. In one embodiment, the STI features 112 have a depth ranging between about 60 nm and about 300 nm.

Referring to FIG. 11d, a second dielectric layer 198, such as silicon nitride, is formed on the first dielectric layer. The first and second dielectric layers function as a hard mask 192. The hard mask 192 is patterned to form various openings 194 in the hard mask 192. The openings define various regions for fin features. In one embodiment, the openings 192 further include one or more dummy openings configured on the STI features to increase the pattern density uniformity or other fabrication consideration. One (or more) epitaxy growth is implemented to form a semiconductor material on the semiconductor substrate 110 within the openings 194. However, the epitaxy growth selectively grows the semiconductor material on the semiconductor substrate 110. Therefore, the dummy openings configured on the STI features 112 remain without epitaxy growth. In one embodiment, the epitaxy grown fin features 120 includes silicon, silicon germanium (SiGe), or other suitable semiconductor material. In another embodiment, the first semiconductor material in the openings 194 within the semiconductor region 114a includes silicon germanium, silicon germanium carbide, germanium, silicon or a combination thereof. The second semiconductor material in the openings 194 within the semiconductor region 114b is different from the first semiconductor material and includes silicon phosphoric, silicon carbide, silicon or a combination thereof.

Referring to FIG. 11e, a polishing process, such as CMP, is applied to remove the excessive epitaxy grown semiconductor material(s), forming the fin features 120. In the present embodiment, the second dielectric layer 198 serves as an polishing stop layer such that the CMP process stops on the second dielectric layer 198.

Referring to FIG. 11f, the hard mask 192 is removed thereafter by one or more etch process. In the present embodiment, only the second dielectric layer 198 is removed by an etch process, such as a wet etch using hot phosphoric acid. The height of the fin features 120 is determined by the thickness of the hard mask 192. In one embodiment, the height of the fin features 120 ranges between about 15 nm and about 60 nm.

Referring to FIG. 11g, one or more gate stacks 130 are formed on fin features 120 configured to form various field effect transistors. The gate stacks 130 include a gate dielectric layer and gate electrode layer. The formation of the gate stacks 130 includes deposition and patterning that further includes lithography process and etch.

FIGS. 12a through 12e are sectional views of a semiconductor structure 210 at different fabrication stages constructed according to various aspects of the present disclosure in another embodiment. The semiconductor structure 210 is similar to the semiconductor structure 200 and is another embodiment of the semiconductor structure 100. The semiconductor structure 210 includes two type fin features 120 with different semiconductor materials, one for p-type FETs and another for n-type FETs. The semiconductor structure 210 and the method making the same are collectively described with reference to FIGS. 12a through 12e. Similar languages are eliminated for simplicity.

Figure 12:
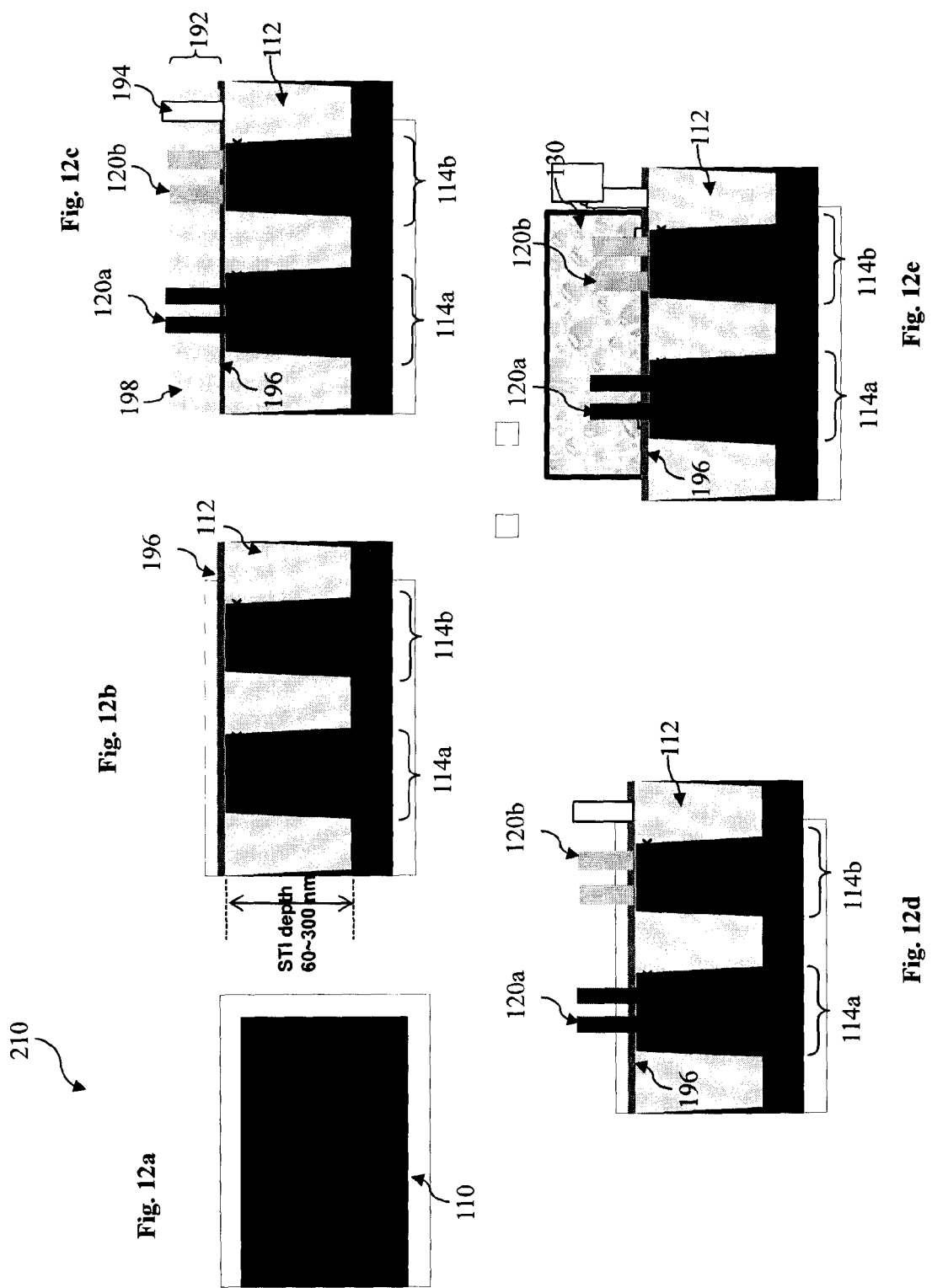
FIGS. 12*a* through 12*e* are sectional views of a semiconductor structure having a multi-fin structure at various fabrication stages constructed according to one or more embodiment.

A semiconductor substrate 110 is provided, as illustrated in FIG. 12a. Referring to FIG. 12b, various STI features 112 are formed in the semiconductor substrate 110, defining various semiconductor regions 114. In the present embodiment, the semiconductor structure 210 includes a first semiconductor region 114a for p-type FET and a second semiconductor region 114b for n-type FET. Particularly, the semiconductor regions 114 and the STI features 112 have a coplanar top surface. Various doped features, such as doped wells and channels are formed in the semiconductor regions 114. In one embodiment, a n-type doped well is formed in the first semiconductor region 114a by an ion implantation using a n-type doping species and a p-type doped well is formed in the second semiconductor region 114b by an ion implantation using a p-type doping species. In another embodiment, one or more doping processes are applied to the channel regions to form the n-type channel for a p-type FET and the p-type channel for a n-type FET. In the present example, a first APT doping process is applied to the n-type channel region in the first semiconductor region 114a using a n-type dopant and a second APT doping process is applied to the p-type channel region in the second semiconductor region 114b using a p-type dopant. In one embodiment, the STI features 112 have a depth ranging between about 60 nm and about 300 nm. A first dielectric layer 196, such as silicon oxide, is formed on the semiconductor substrate 110.

Referring to FIG. 12c, a second dielectric layer 198, such as silicon nitride, is formed on the first dielectric layer. The first and second dielectric layers function as a hard mask 192. The hard mask 192 is patterned to form various openings 194 in the hard mask 192. The openings define various regions for fin features. In one embodiment, the openings 192 further include one or more dummy openings configured on the STI features to increase the pattern density uniformity or other fabrication consideration. Two epitaxy growth are implemented to form fin features 120 in the first semiconductor region 114a using the first semiconductor material and fin features 120 in the second semiconductor region 114b using the second semiconductor material, respectively. In one embodiment, the first semiconductor material includes silicon germanium, silicon germanium carbide, germanium, silicon or a combination thereof. The second semiconductor material includes silicon phosphoric, silicon carbide, silicon or a combination thereof. As the epitaxy growth selectively grows the semiconductor material on the semiconductor substrate 110, the dummy openings on the STI features 112 remain without epitaxy growth. A polishing process, such as CMP, is applied to remove the excessive epitaxy grown semiconductor materials, forming the fin features 120a in the first semiconductor region 114a and the fin features 120b in the second semiconductor region 114b. In the present embodiment, the second dielectric layer 198 serves as an polishing stop layer such that the CMP process stops on the second dielectric layer 198.

Referring to FIG. 12d, the second dielectric layer 198 is removed by an etch process, such as a wet etch using hot phosphoric acid. The height of the fin features 120 is determined by the thickness of the hard mask 192. In one embodiment, the height of the fin features 120 ranges between about 15 nm and about 60 nm.

Referring to FIG. 12e, one or more gate stacks 130 are formed on fin features 120a and 120b configured to form various field effect transistors. The gate stacks 130 include a gate dielectric layer and gate electrode layer. The formation of the gate stacks 130 includes deposition and patterning that further includes lithography process and etch.

Figure 13:
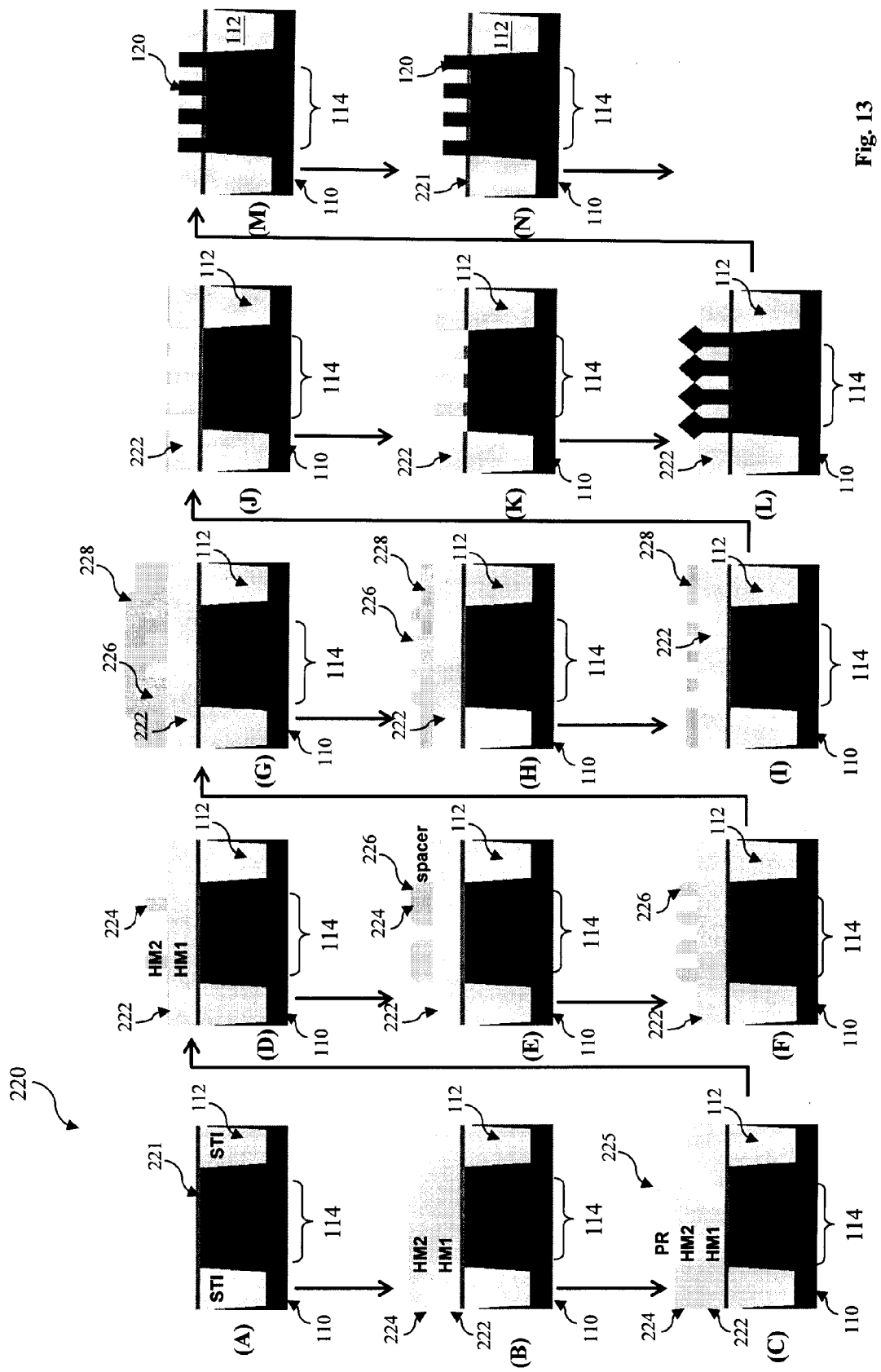
FIG. 13 illustrates sectional views of a semiconductor structure having a multi-fin structure at various fabrication stages constructed according to another embodiment.

FIG. 13A through 13N illustrate sectional views of a semiconductor structure 220 at various fabrication stages constructed according to one or more embodiments. The semiconductor structure 220 is another embodiment of the semiconductor structure 100. The semiconductor structure 220 and the method making the same are collectively described with reference to FIGS. 13A through 13N. As noted above, the hard mask used to form fin features may be formed by other methods for dimension control, fin profile control and/or other considerations. The method of making the semiconductor structure 220 includes forming a hard mask for fin feature formation includes a reverse-tone process. For simplicity, similar languages are eliminated and similar numerals are used in those figures without detailed indication.

A semiconductor substrate 110 is provided, as illustrated in FIG. 13A. Still referring to FIG. 13A, various STI features 112 are formed in the semiconductor substrate 110, defining various semiconductor regions 114. Particularly, the semiconductor regions 114 and the STI features 112 have a coplanar top surface.

Referring to FIG. 13A, various doped features are formed in the semiconductor regions 114. In one embodiment, a doped well is formed in the semiconductor region 114 by an ion implantation using a proper type doping species, such as n-type dopant or p-type dopant. In another embodiment, one or more doping processes are applied to the channel region to form the channel for a field effect transistor, such as a MOSFET. For example, an APT doping process is applied to the channel region. A dielectric layer 221, such as silicon oxide, is formed on the semiconductor substrate 110.

Referring to FIG. 13B, a first hard mask 222 and a second hard mask 224 of respective dielectric materials are formed on the first dielectric layer 221. The first hard mask 222 defines the height of the fin features to be formed.

Referring to FIG. 13C, a patterned resist layer 225 is formed by a lithography process and is used to pattern the second hard mask 224.

Referring to FIG. 13D, the second hard mask 224 is patterned by an etch process using the patterned resist layer 225 as an etch mask. The patterned resist layer 225 is removed thereafter by wet stripping or plasma ashing.

Referring to FIG. 13E, spacers 226 are formed on the sidewalls of the patterned second hard mask 224 by a procedure including deposition and anisotropic etch. The spacers 226 include one or more dielectric material different from the second mask 224.

Referring to FIG. 13F, the patterned second hard mask 224 is removed by an etch process tuned to selectively remove the second hard mask 224 while the spacers 226 remain.

Referring to FIG. 13G, another dielectric layer 228 is formed on the spacers 226 and the first hard mask 222 using a suitable material such as bottom anti-reflective coating (BARC) or spin-on glass (SOG).

Referring to FIG. 13H, the dielectric layer 228 is partially removed such that the top surface of spacers 226 is exposed by a procedure that includes CMP and etch back.

Referring to FIG. 13I, the spacers 226 are removed by an etch process that selectively removes the spacers 226, resulting in the dielectric layer 228 patterned to have various openings.

Referring to FIG. 13J, the first hard mask 222 is patterned by an etch process using the dielectric layer 228 as an etch mask. The etch process selectively etches the first hard mask 224 through the openings of the dielectric layer 228. The dielectric layer 228 may be partially consumed during the etch process.

Referring to FIG. 13K, the dielectric layer 221 is etched through the openings of the first hard mask 222 such that the semiconductor substrate 110 is exposed within the openings. The dielectric layer 228 is removed as well by the same etch process or alternatively another etch process.

Referring to FIG. 13L, an epitaxy growth is implemented to grow a semiconductor material on the semiconductor substrate 110 within the openings of the first hard mask 222. The semiconductor material includes silicon, silicon germanium or other suitable semiconductor material. The epitaxy growth selectively grows the semiconductor material on the semiconductor substrate 110. In another embodiment, two epitaxy growths are performed to respectively grow a first semiconductor material in one semiconductor region for p-type FETs and a second semiconductor material in a second semiconductor region for n-type FETs. The first semiconductor material includes silicon germanium, silicon germanium carbide, germanium, silicon or a combination thereof. The second semiconductor material is different from the first semiconductor material and includes silicon phosphoric, silicon carbide, silicon or a combination thereof.

Referring to FIG. 13M, a polishing process, such as CMP, is applied to remove the excessive epitaxy grown semiconductor material(s), forming the fin features 120. In the present embodiment, the first hard mask 222 serves as an polishing stop layer such that the CMP process stops on the first hard mask 222.

Referring to FIG. 13N, the first hard mask 222 is removed thereafter by one or more etch process. In the present embodiment, only the first hard mask 222 is removed by an etch process, such as a wet etch using hot phosphoric acid. The dielectric layer 221 remains on the semiconductor substrate 110 in the areas between the fin features 120.

Other fabrication steps may be implemented before, during and after the operations of the method. For example, one or more gate stacks are formed on fin features 120 configured to form various field effect transistors. The gate stacks include a gate dielectric layer and gate electrode layer. The formation of the gate stacks includes deposition and patterning that further includes lithography process and etch.

FIG. 14a through 14h illustrate sectional views of a semiconductor structure 230 at various fabrication stages constructed according to other embodiments. The semiconductor structure 230 is another embodiment of the semiconductor structure 100. The semiconductor structure 230 and the method making the same are collectively described below. Particularly, the method of making the semiconductor structure 230 includes forming a hard mask for fin feature formation includes a reverse-tone process. For simplicity, similar numerals are used in those figures.

A semiconductor substrate 110 is provided, as illustrated in FIG. 14a. Still referring to FIG. 14a, various STI features 112 are formed in the semiconductor substrate 110, defining various semiconductor regions 114. Particularly, the semiconductor regions 114 and the STI features 112 have a coplanar top surface.

Still referring to FIG. 14a, various doped features are formed in the semiconductor regions 114. In one embodiment, a doped well is formed in the semiconductor region 114 by an ion implantation using a proper type doping species, such as n-type dopant or p-type dopant. In another embodiment, one or more doping processes are applied to the channel region to form the channel for a field effect transistor, such as a MOSFET. For example, an APT doping process is applied to the channel region.

A first dielectric layer 232 (such as silicon oxide) and a second dielectric material 234 (such as silicon nitride) are formed on the semiconductor substrate 110 by proper techniques, such as thermal oxidation and/or CVD. In one embodiment, the first dielectric layer 222 includes silicon oxide with a thickness ranging between about 20 angstrom and about 300 angstrom. In another embodiment, the second dielectric layer 224 includes silicon nitride oxide with a thickness tuned with the height of the fin features.

A hard mask layer 236 is formed on the second dielectric layer 224 using a suitable dielectric layer using a technique, such as CVD. A patterned resist layer 238 is formed on the hard mask layer 236 by a lithography process that includes spin coating, exposure, post-exposure baking, developing and other baking/cleaning steps according to one example.

Referring to FIG. 14b, a hard mask layer 236 is patterned by an etch process using the patterned resist layer 238 as an etch mask. The patterned resist layer 238 is removed thereafter by wet stripping or plasma ashing. Spacers 226 are formed on the sidewalls of the patterned hard mask 236 by a procedure including deposition and anisotropic etch. The spacers 226 include one or more dielectric material different from the hard mask layer 236.

Referring to FIG. 14c, the patterned hard mask layer 236 is removed by an etch process tuned to selectively remove the hard mask layer 236 while the spacers 226 remain. Another dielectric layer 228 is formed on the spacers 226 and the second dielectric layer 234 using a suitable material such as BARC or SOG. The dielectric layer 228 is recessed such that the top surface of spacers 226 is exposed by a procedure, which includes CMP and etch back according to one embodiment.

Referring to FIG. 14d, the spacers 226 are removed by an etch process that selectively removes the spacers 226, resulting in the dielectric layer 228 patterned to have various openings.

Figure 14E:
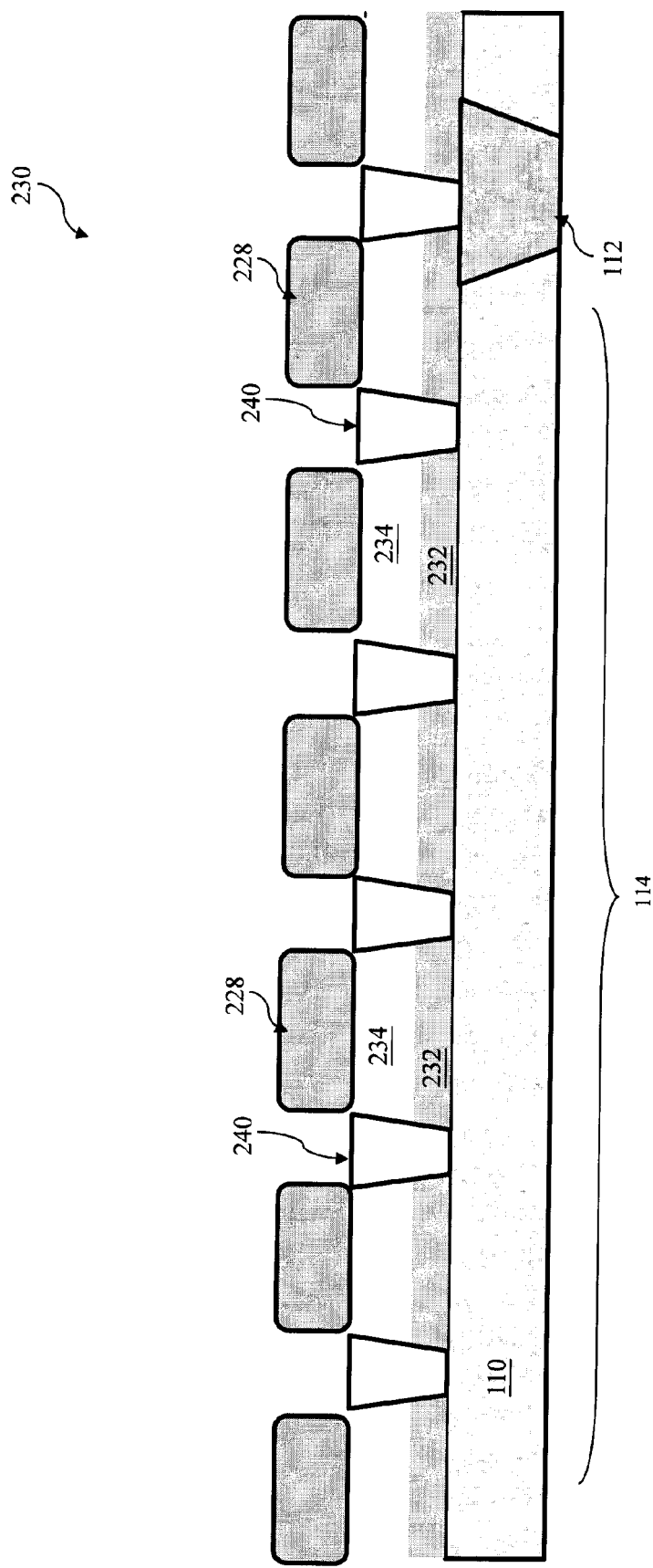

Referring to FIG. 14e, the first dielectric layer 232 and second dielectric layers 234 are patterned by an etch process using the dielectric layer 228 as an etch mask. The etch process selectively etches the first and second dielectric layers through the openings of the dielectric layer 228, resulting in openings (or trenches) 240 formed in the first and second dielectric layers 232 and 234. In the present embodiment, the trenches 240 have a taper profile.

In one embodiment, the etch process includes two etch steps to selectively etch the second dielectric layer 224 and the first dielectric layer 222, respectively. Especially, two etch steps are tuned to have anisotropic or isotropic etch effect such that the openings 240 are tuned to have a proper sectional profile.

In another embodiment, the etch process includes three etch steps to provide more freedom to tune the profiles of the openings 240, which will determine the sectional profile of the fin features. In yet another embodiment, three dielectric layers are utilized to be formed on the semiconductor substrate 110 and are patterned using the dielectric layer 228 as an etch mask by an etch process that may include three etch steps tuned to etch the three dielectric layers, respectively.

Referring to FIG. 14f, the dielectric layer 228 is removed by an etch process. The patterned first and second dielectric layers 232 and 234 may be further trimmed or modified by additional one or more etch step, such as wet etch to selectively etch one of the first and second dielectric layers.

Referring to FIG. 14g, an epitaxy growth is implemented to grow a semiconductor material on the semiconductor substrate 110 within the openings of the first hard mask 222. The semiconductor material includes silicon, silicon germanium or other suitable semiconductor material. The epitaxy growth selectively grows the semiconductor material on the semiconductor substrate 110. In another embodiment, two epitaxy growths are performed to respectively grow a first semiconductor material in one semiconductor region for p-type FETs and a second semiconductor material in a second semiconductor region for n-type FETs. The first semiconductor material includes silicon germanium, silicon germanium carbide, germanium, silicon or a combination thereof. The second semiconductor material is different from the first semiconductor material and includes silicon phosphoric, silicon carbide, silicon or a combination thereof.

A polishing process, such as CMP, is applied to remove the excessive epitaxy grown semiconductor material(s), forming the fin features 120. In the present embodiment, the second dielectric layer 234 serves as an polishing stop layer such that the CMP process stops on the first hard mask 222.

Referring to FIG. 14h, the second dielectric layer 234 is removed thereafter by one or more etch process. In the present embodiment, only the second dielectric layer 234 is removed while the first dielectric layer 232 remains on the semiconductor substrate 110 within the areas between the fin features 120.

Other fabrication steps may be implemented before, during and after the operations of the method. In one embodiment, one or more gate stacks are formed on fin features 120 configured to form various field effect transistors. The gate stacks include a gate dielectric layer and gate electrode layer. The formation of the gate stacks includes deposition and patterning that further includes lithography process and etch.

In another embodiment, the method includes another procedure to form source and drain. In one example, the source and drain regions include light doped drain (LDD) regions and heavily doped source and drain (S/D) features, collectively referred to as source and drain regions, formed by various ion implantation processes. When the semiconductor regions 114 include both n-type FETs and p-type FETs, the source and drain regions are formed for the n-type FETs and the p-type FETs, respectively, using proper doping species. As one example for nFETs, the LDD features are formed by an ion implantation with a light doping dose. Thereafter, spacers are formed by dielectric deposition and anisotropic etch, such as plasma etch. Then the heavily doped S/D features are formed by an ion implantation with a heavy doping dose. The various source and drain features of the pFETs can be formed in a similar procedure but with opposite doping type. In one embodiment of the procedure to form various source and drain features for both nFETs and pFETs, the LDD features of nFETs are formed by an ion implantation while the regions of pFETs are covered by a patterned photoresist layer; the LDD features of pFETs are formed by an ion implantation while the regions of nFETs; then spacers are formed to nFET gate stacks and pFET gate stacks by deposition and etch. the S/D features of nFETs are formed by ion implantation while the regions of pFETs are covered by another patterned photoresist layer; and the S/D features of pFETs are formed by ion implantation while the regions of nFETs are covered by another patterned photoresist layer. In one embodiment, a high temperature annealing process is followed to activate the various doping species in the source and drain regions.

In yet another embodiment, an inter-level dielectric (ILD) layer is formed on the semiconductor substrate 110. The ILD layer includes silicon oxide, low k dielectric material, other suitable dielectric materials, or combinations thereof. The ILD layer is formed by a suitable technique, such as CVD. For example, a high density plasma CVD can be implemented to form the ILD layer.

In yet another embodiments, the method further includes a procedure to form various interconnection features designed to couple various devices (including various multi-fin devices) to form functional circuits. The interconnection features include vertical interconnects, such as contacts and vias, and horizontal interconnects, such as metal lines. The various interconnection features may use various conductive materials including copper, tungsten and silicide. In one example, a damascene process is used to form copper-based multilayer interconnection structure. In another embodiment, tungsten is used to form tungsten plug in the contact holes. In another example, silicide is used to form various contact on source and drain regions for reduced contact resistance.

In another embodiment, a pFET has a strained structure for enhanced carrier mobility and improved device performance. In furtherance of the embodiment, silicon germanium (SiGe) is formed in the source and drain regions of the pFET to achieve a proper stress effect. In another embodiment, an nFET has a strained structure for enhanced carrier mobility and improved device performance. In furtherance of the embodiment, silicon carbide (SiC) is formed in the source and drain regions of the nFET to achieve a proper stress effect.

The present disclosure can be used in various applications where multi-fin devices are incorporated for enhanced performance. For example, the multi-fin devices can be used to form static random access memory (SRAM) cells. In other examples, the multi-fin devices can be incorporated in various integrated circuit, such as logic circuit, dynamic random access memory (DRAM), flash memory, or imaging sensor.

Thus, the present disclosure provides a field effect transistor (FET) structure. The FET structure includes shallow trench isolation (STI) features formed in a semiconductor substrate; a plurality of semiconductor regions defined in the semiconductor substrate and isolated from each other by the STI features; and a multi-fin active region of a first semiconductor material disposed on one of the semiconductor regions of the semiconductor substrate.

In one embodiment, of the FET structure, the multi-fin active region includes a plurality of fin features of the first semiconductor material oriented in a first direction and spaced away from each other in a second direction perpendicular to the first direction.

In another embodiment, the STI features and the semiconductor regions of the semiconductor substrate have a coplanar top surface; and the multi-fin active region is disposed on the top surface.

In yet another embodiment, the FET structure further includes a FET formed on the multi-fin active region. The FET includes a gate disposed over a fin feature of the plurality of fin features; a channel region defined in the fin feature and underlying the gate, the channel region having a top portion and two opposing sidewall portions; and source and drain formed in the fin feature and disposed on sides of the gate.

In yet another embodiment, the two opposing sidewalls of the channel region has an intersecting angle with top surface of the semiconductor substrate, the intersecting angle being greater than 90 degree.

In yet another embodiment, the fin feature includes a sectional profile having a first width in a middle portion and a second width in a lower portion, the second width being less than the first width. In one example, the sectional profile further includes a third width in an upper portion, the third width being less than the first width. In yet another embodiment, the opposite sidewalls are tilted toward each when approaching the top surface.

In yet another embodiment, the semiconductor substrate includes a second semiconductor material that is different from the first dielectric material.

In yet another embodiment, the multi-fin active region is configured for p-type FETs; the second semiconductor material includes silicon; and the first semiconductor material is selected from the group consisting of silicon germanium, silicon germanium carbide, germanium, silicon and combinations thereof.

In yet another embodiment, the multi-fin active region is configured for n-type FETs; the second semiconductor material includes silicon; and the first semiconductor material is selected from the group consisting of silicon phosphoric, silicon carbide, silicon and combinations thereof.

In yet another embodiment, the FET structure further includes a plurality of FETs at least partially formed on the multi-fin active region, wherein the plurality of FETs are configured and electrically connected to form two cross-coupled inverters.

The present disclosure also provides another embodiment of a fin-like field effect transistor (FinFET) structure. The FinFET structure includes shallow trench isolation (STI) features formed in a semiconductor substrate; a plurality of semiconductor regions defined in the semiconductor substrate and isolated from each other by the STI features; and a plurality of multi-fin active regions of a first semiconductor material wherein each of the multi-fin active regions is disposed on respective one of the semiconductor regions and is isolated from others of the multi-fin active regions.

In one embodiment of the FinFET structure, the STI features and the semiconductor regions of the semiconductor substrate have a coplanar top surface; and the multi-fin active region is disposed on the top surface.

In another embodiment, the each of the multi-fin active regions includes multiple fin features separated from each in a first direction and aligned in a second direction perpendicular to the first direction.

In yet another embodiment, the FinFET structure further includes a dielectric material layer disposed on the top surface of the semiconductor substrate and horizontally separating the multiple fin features in the each of the multi-fin active regions from each other.

In yet another embodiment, the FinFET structure further includes a FinFET device formed on one of multiple fin features. The FinFET device includes a gate stack disposed on the fin feature; a channel region formed in the fin feature and underlying the gate stack; and source and drain features formed in the fin feature, spaced in the second direction and disposed on two sides of the gate stack. The gate stack includes a high k dielectric material layer and a metal electrode disposed on the high k dielectric material layer. The fin features are formed by epitaxy growth. The semiconductor substrate includes a second semiconductor material different from the first dielectric material.

The present disclosure also provides one embodiment of a method of forming a fin field effect transistor (FinFET) structure. The method includes forming a plurality of shallow trench isolation (STI) features in a semiconductor substrate of a first semiconductor material, defining a plurality of bulk-semiconductor areas separated from each other by the STI features; forming a first hard mask layer on the semiconductor substrate, the first hard mask layer being patterned to have a plurality of openings within one of the bulk-semiconductor areas; and epitaxy growing a second semiconductor material on the semiconductor substrate within the plurality of openings of the first hard mask layer, forming a multi-fin active region having multiple fin features within the one of the bulk-semiconductor areas.

In one embodiment, the method further includes performing a chemical mechanical polishing (CMP) process to the second semiconductor material after the epitaxy growing; and thereafter removing the first hard mask layer.

In another embodiment, the first semiconductor material is silicon; and the second semiconductor material is different from the first semiconductor material.

In yet another embodiment, the forming of the first hard mask layer includes forming a dielectric material layer on the semiconductor substrate; patterning the dielectric material layer to form a plurality of dielectric mesas on the semiconductor substrate; forming spacer features on sidewalls of the dielectric mesas; and removing the dielectric mesas.

In yet another embodiment, the method further includes a reverse-tone process that includes forming a material layer on the semiconductor substrate and within openings defined by the spacer features; and removing the spacer features.

In yet another embodiment, the forming of the material layer includes forming the material layer by spin coating; and selectively etch back the material layer to expose the spacer features.

In yet another embodiment, the forming of the material layer includes forming the material layer by deposition; and performing a polishing process to the material layer to expose the spacer features.

In yet another embodiment, the method further includes forming a first dielectric layer on the semiconductor substrate and a second dielectric layer on the first dielectric layer, prior to the forming of the first hard mask layer; and etching the second and first hard mask layers through the openings of the first hard mask layer, wherein the epitaxy growing includes growing the second semiconductor material within openings of the first and second dielectric layers.

In yet another embodiment, the etching includes a first etch step to etch the second dielectric layer and a second etch step to etch the first dielectric layer. In yet another embodiment, the method further includes performing a chemical mechanical polishing (CMP) process to the epitaxy semiconductor fin active regions; and thereafter, removing the second dielectric layer.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A field effect transistor (FET) structure, comprising:
shallow trench isolation (STI) features formed in a semiconductor substrate;
a plurality of semiconductor regions defined in the semiconductor substrate and isolated from each other by the STI features; and
a first and second fin features comprising a first semiconductor material disposed on one of the semiconductor regions of the semiconductor substrate, wherein a bottom surface of each of the first and second fin features is substantially coplanar with a top surface of the semiconductor region interposing the first and second fin features.

2. The FET structure of claim 1, wherein the first and second fin features of the first semiconductor material are oriented in a first direction and spaced away from each other in a second direction perpendicular to the first direction.

3. The FET structure of claim 2, wherein:
the STI features and the semiconductor regions of the semiconductor substrate have a coplanar top surface.

4. The FET structure of claim 3, further comprising:
a gate disposed over the first fin feature;
a channel region defined in the first fin feature and underlying the gate, the channel region having a top portion and two opposing sidewall portions; and
a source and drain formed in the first fin feature and disposed on sides of the gate.

5. The FET structure of claim 4, wherein the two opposing sidewalls of the channel region have an inner intersecting angle with respect to the top surface of the semiconductor substrate, the inner intersecting angle being greater than 90 degrees.

6. The FET structure of claim 1, wherein the first fin feature includes a sectional profile having a first width in a middle portion and a second width in a lower portion, the second width being less than the first width.

7. The FET structure of claim 6, wherein the sectional profile further includes a third width in an upper portion, the third width being less than the first width.

8. The FET structure of claim 4, wherein the opposite sidewalls are tilted toward each when approaching the top surface of the semiconductor substrate.

9. The FET structure of claim 1, wherein the semiconductor substrate includes a second semiconductor material that is different from the first semiconductor material.

10. The FET structure of claim 9, wherein:
the first and second fin features are configured for p-type FETs;
the second semiconductor material includes silicon; and
the first semiconductor material is selected from a group consisting of silicon germanium, silicon germanium carbide, germanium, and combinations thereof.

11. The FET structure of claim 9, wherein:
the first and second fin features are configured for n-type FETs;
the second semiconductor material includes silicon; and
the first semiconductor material is selected from the group consisting of silicon phosphoric, silicon carbide, and combinations thereof.

12. The FET structure of claim 1, wherein the FET structure is configured and electrically connected other features to form two cross-coupled inverters.

13. A semiconductor device comprising:
a plurality of shallow trench isolation (STI) features in a semiconductor substrate of a first semiconductor material, thereby defining a plurality of semiconductor areas separated from each other by the STI features;
a plurality of fin features extending from one of the semiconductor areas, wherein the plurality of fin features have a bottom surface substantially coplanar with a top surface of a region the one semiconductor area interposing the plurality of fin features; and
a dielectric layer disposed on the region of the one semiconductor area, wherein the dielectric layer interfaces with the top surface.

14. The structure of claim 13, wherein:
the first semiconductor material is silicon.

15. The structure of claim 14, wherein:
the plurality of fin features are a second semiconductor material, different from the first semiconductor material.

16. A field effect transistor (FET) structure, comprising:
shallow trench isolation (STI) features formed in a semiconductor substrate;
a plurality of semiconductor regions defined in the semiconductor substrate and isolated from each other by the STI features; and
a first feature and a second fin feature, both comprising a first semiconductor material and both disposed on one of the semiconductor regions of the semiconductor substrate;
wherein the first and second fin features have a bottom surface substantially coplanar with a contiguous top surface of semiconductor material, the contiguous top surface of semiconductor material interposing the first and second fin features;
wherein the STI features and the semiconductor regions of the semiconductor substrate also have a coplanar top surface; and
the first and second fin features extend above the top surface.

17. The FET structure of claim 16, further comprising:
a gate disposed over the first fin feature;
a channel region defined in the first fin feature and underlying the gate, the channel region having a top portion and two opposing sidewall portions; and
a source and drain formed in the first fin feature and disposed on sides of the gate.

18. The FET structure of claim 17, wherein the two opposing sidewalls of the channel region have an inner intersecting angle with the top surface of the semiconductor substrate, the inner intersecting angle being greater than 90 degrees.

19. The FET structure of claim 13, wherein the first fin feature includes a sectional profile having a first width in a middle portion and a second width in a lower portion, the second width being less than the first width.

* * * * *